(12) United States Patent
Kim et al.

(10) Patent No.: US 10,032,697 B2
(45) Date of Patent: Jul. 24, 2018

(54) ELECTRONIC COMPONENT PACKAGE AND ELECTRONIC DEVICE INCLUDING THE SAME

(71) Applicant: SAMSUNG ELECTRO-MECHANICS CO., LTD., Suwon-si, Gyeonggi-do (KR)

(72) Inventors: Han Kim, Suwon-si (KR); Young Gwan Ko, Suwon-si (KR); Kang Heon Hur, Suwon-si (KR); Kyung Moon Jung, Suwon-si (KR); Sung Han Kim, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/203,006

(22) Filed: Jul. 6, 2016

(65) Prior Publication Data

US 2017/0162527 A1    Jun. 8, 2017

(30) Foreign Application Priority Data

Dec. 8, 2015  (KR) .......................... 10-2015-0174025

(51) Int. Cl.
*H01L 23/48*    (2006.01)
*H01L 23/538*   (2006.01)
(Continued)

(52) U.S. Cl.
CPC ........ *H01L 23/481* (2013.01); *H01L 23/3107* (2013.01); *H01L 23/3128* (2013.01);
(Continued)

(58) Field of Classification Search
CPC ............. H01L 23/5389; H01L 23/3128; H01L 23/49838; H01L 23/481; H01L 23/49822;
(Continued)

(56) References Cited

U.S. PATENT DOCUMENTS 9,576,926 B2 * 2/2017 Yu ........................... H01L 24/17
2002/0084107 A1   7/2002 Chang et al.
(Continued)

FOREIGN PATENT DOCUMENTS

JP    2000-151111 A    5/2000
JP    2002-064274 A    2/2002
(Continued)

OTHER PUBLICATIONS

Taiwanese Office Action issued in corresponding Taiwanese Patent Application No. 105121976, dated Jan. 15, 2018, with English Translation.
(Continued)

*Primary Examiner* — Shouxiang Hu
(74) *Attorney, Agent, or Firm* — McDermott Will & Emery LLP

(57) ABSTRACT

An electronic component package may include: a redistribution layer including a first insulating layer, a first conductive pattern disposed on the first insulating layer, and a first via connected to the first conductive pattern while penetrating through the first insulating layer; an electronic component disposed on the redistribution layer; and an encapsulant encapsulating the electronic component. The first via has a horizontal cross-sectional shape in which a distance between first and second edge points of the first via in a first direction passing through the center of the first via and the first and second edge points thereof is shorter than that between third and fourth edge points of the first via in a second direction perpendicular to the first direction and passing through the center of the first via and the third and fourth points thereof.

15 Claims, 23 Drawing Sheets

(51) Int. Cl.
*H01L 23/31* (2006.01)
*H01L 23/498* (2006.01)
*H01L 23/522* (2006.01)
*H01L 23/528* (2006.01)
*H01L 23/00* (2006.01)

(52) U.S. Cl.
CPC .. *H01L 23/49822* (2013.01); *H01L 23/49827* (2013.01); *H01L 23/49838* (2013.01); *H01L 23/5226* (2013.01); *H01L 23/5283* (2013.01); *H01L 23/5384* (2013.01); *H01L 23/5389* (2013.01); *H01L 24/13* (2013.01); *H01L 2224/0239* (2013.01); *H01L 2224/02372* (2013.01); *H01L 2224/0401* (2013.01); *H01L 2224/05025* (2013.01); *H01L 2224/05111* (2013.01); *H01L 2224/05116* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/13014* (2013.01); *H01L 2224/13016* (2013.01); *H01L 2224/13111* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16227* (2013.01); *H01L 2924/0105* (2013.01); *H01L 2924/01013* (2013.01); *H01L 2924/01028* (2013.01); *H01L 2924/01029* (2013.01); *H01L 2924/01047* (2013.01); *H01L 2924/01079* (2013.01); *H01L 2924/01082* (2013.01); *H01L 2924/10252* (2013.01); *H01L 2924/10253* (2013.01); *H01L 2924/10329* (2013.01); *H01L 2924/186* (2013.01); *H01L 2924/2064* (2013.01); *H01L 2924/3025* (2013.01)

(58) Field of Classification Search
CPC . H01L 23/5384; H01L 23/5226; H01L 24/13; H01L 23/5283; H01L 23/3107; H01L 23/49827; H01L 2224/13144; H01L 2924/10252; H01L 2224/02372; H01L 2924/10253; H01L 2924/10329; H01L 2924/3025

USPC ........................................ 257/774, 773, 787
See application file for complete search history.

(56) References Cited

U.S. PATENT DOCUMENTS

| | | | |
|---|---|---|---|
| 2008/0012129 | A1 | 1/2008 | Watanabe |
| 2009/0278263 | A1 | 11/2009 | McCarthy et al. |
| 2011/0115060 | A1 | 5/2011 | Chiu et al. |
| 2012/0104604 | A1 | 5/2012 | McCarthy et al. |
| 2013/0062761 | A1* | 3/2013 | Lin .................... H01L 23/49816 257/738 |
| 2013/0241040 | A1 | 9/2013 | Tojo et al. |
| 2013/0249106 | A1 | 9/2013 | Lin et al. |
| 2013/0249115 | A1 | 9/2013 | Lin et al. |
| 2013/0292846 | A1* | 11/2013 | Lee ........................ H01L 23/538 257/774 |
| 2014/0103527 | A1 | 4/2014 | Marimuthu et al. |
| 2014/0159251 | A1 | 6/2014 | Marimuthu et al. |
| 2017/0141056 | A1* | 5/2017 | Huang .................... H01L 24/05 |

FOREIGN PATENT DOCUMENTS

| | | |
|---|---|---|
| JP | 2008-021936 A | 1/2008 |
| JP | 2010-092930 A | 4/2010 |
| JP | 2011-155313 A | 8/2011 |
| JP | 2013-219324 A | 10/2013 |
| JP | 2013-543272 A | 11/2013 |
| JP | 2014-192189 A | 10/2014 |
| JP | 2015-076565 A | 4/2015 |
| KR | 2002-0054474 A | 7/2002 |
| KR | 10-2009-0118705 A | 11/2009 |
| TW | 201118994 A | 6/2011 |
| TW | 201423851 A | 6/2014 |
| WO | 2012/061381 A2 | 5/2012 |

OTHER PUBLICATIONS

Japanese Office Action issued in corresponding Japanese Patent Application No. 2016-137119, dated May 22, 2018, with English Translation.

* cited by examiner

ELECTRONIC COMPONENT PACKAGE AND ELECTRONIC DEVICE INCLUDING THE SAME

CROSS-REFERENCE TO RELATED APPLICATION

This application claims benefit of priority to Korean Patent Application No. 10-2015-0174025 filed on Dec. 8, 2015, with the Korean Intellectual Property Office, the disclosure of which is incorporated herein by reference.

TECHNICAL FIELD

The present disclosure relates to an electronic component package and an electronic device including the same.

BACKGROUND

Electronic component package technology is a type of package technology for electrically connecting an electronic component to a printed circuit board (PCB), for example, amain board of an electronic device, or the like, and protecting the electronic component from external impacts, and is distinguished from a technology for simply embedding an electronic component in a printed circuit board, for example, an interposer board.

Recently, one of the main trends in developing technology associated with electronic components is to decrease a size of components. Therefore, in a package field, in accordance with an increase in demand for small sized electronic components, or the like, a package having a large number of pins while having a small size has been demanded. In accordance with the technical demand as described above, recently, a pattern and a via of a redistribution layer performing a redistribution function of the electronic component have been finely formed.

Recently, in package technology, the reliability of vias of the redistribution layer has come to prominence. In a case in which a via of a redistribution layer, introduced for redistribution of the electronic component, is exposed to a severe conditions, interfacial delamination or cracks may occur in the via. Therefore, there is a need to significantly decrease defects caused by interfacial delamination or cracks by changing a design of the via, or the like, to significantly decrease heat stress applied to the via.

SUMMARY

An aspect of the present disclosure may provide an electronic component package having a novel structure in which reliability of a via of a redistribution layer is improved, and an electronic device including the same.

According to an aspect of the present disclosure, there is provided an electronic component package in which among vias of a redistribution layer, vias disposed in a portion of the redistribution layer on which stress is concentrated are formed to have a non-circular shape in consideration of a direction in which stress is concentrated, so that the concentration of stress may be decreased.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
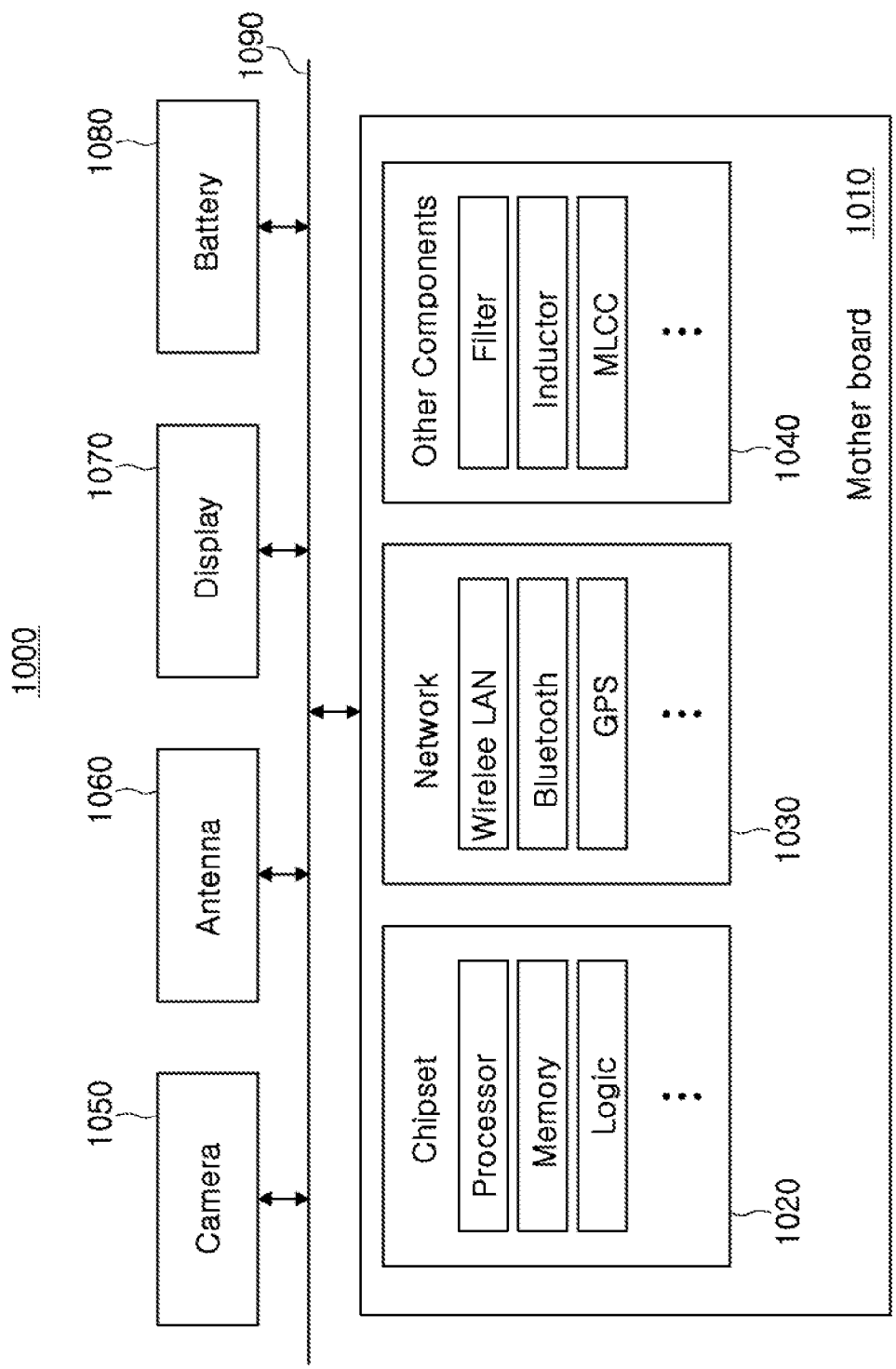
FIG. 1 is a block diagram schematically illustrating an example of an electronic device system.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the present disclosure. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

Electronic Device

FIG. 1 is a block diagram schematically illustrating an example of an electronic device system. Referring to FIG. 1, an electronic device 1000 may accommodate a mother board 1010 therein. Chip-related components 1020, network-related components 1030, other components 1040, and the like, may be physically and/or electrically connected to the mother board 1010. These components may be coupled to other components to be described below, thereby forming various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphic processor (for example, a graphic processing unit (GPU)), a digital signal processor, a cryptographic processor, a microprocessor, a microcontroller, or the like; a logic chip such as an analog-to-digital converter (ADC), an application-specific integrated circuit (ASIC), or the like, and the like. However, the chip related components 1020 are not limited thereto, but may also include other types of chip related components. Further, these components 1020 may be combined with each other.

The network-related component 1030 may include protocols such as wireless fidelity (Wi-Fi) (Institute of Electrical and Electronics Engineers (IEEE) 802.11 standard family, or the like), worldwide interoperability for microwave access (WiMAX) (IEEE 802.16 standard family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, 5G protocols and any other wireless and wired protocols designated after the above-mentioned protocols. However, the network-related components 1030 are not limited thereto, and may also include any of a plurality of other wireless or wired standards or protocols. Further, these components 1030 may be combined with each other as well as the above-mentioned chip-related components 1020.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), and the like. However, other components 1040 are not limited thereto, but may also include passive components used for various other purposes, and the like. Further, other components 1040 may be combined with each other together with the above-mentioned chip-related components 1020 and/or the above-mentioned network-related components 1030.

The electronic device 1000 may include other components which may or may not be physically and/or electrically connected to the mother board 1010 depending on the kind of electronic device 1000. Examples of such other components may include a camera module 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage device (for example, a hard disk drive) (not illustrated), a compact disk (CD) (not illustrated), and a digital versatile disk (DVD) (not illustrated). However, these other components are not limited thereto, but may also include other components used for various purposes depending on the kind of electronic device 1000.

The electronic device 1000 may be a smartphone, a personal digital assistant, a digital video camera, a digital still camera, a network system, a computer, a monitor, a tablet, a laptop, a netbook, a television, a video game machine, a smartwatch, or the like. However, the electronic device 1000 is not limited thereto, and may be any other electronic device processing data in addition to the above-mentioned electronic devices.

Figure 2:
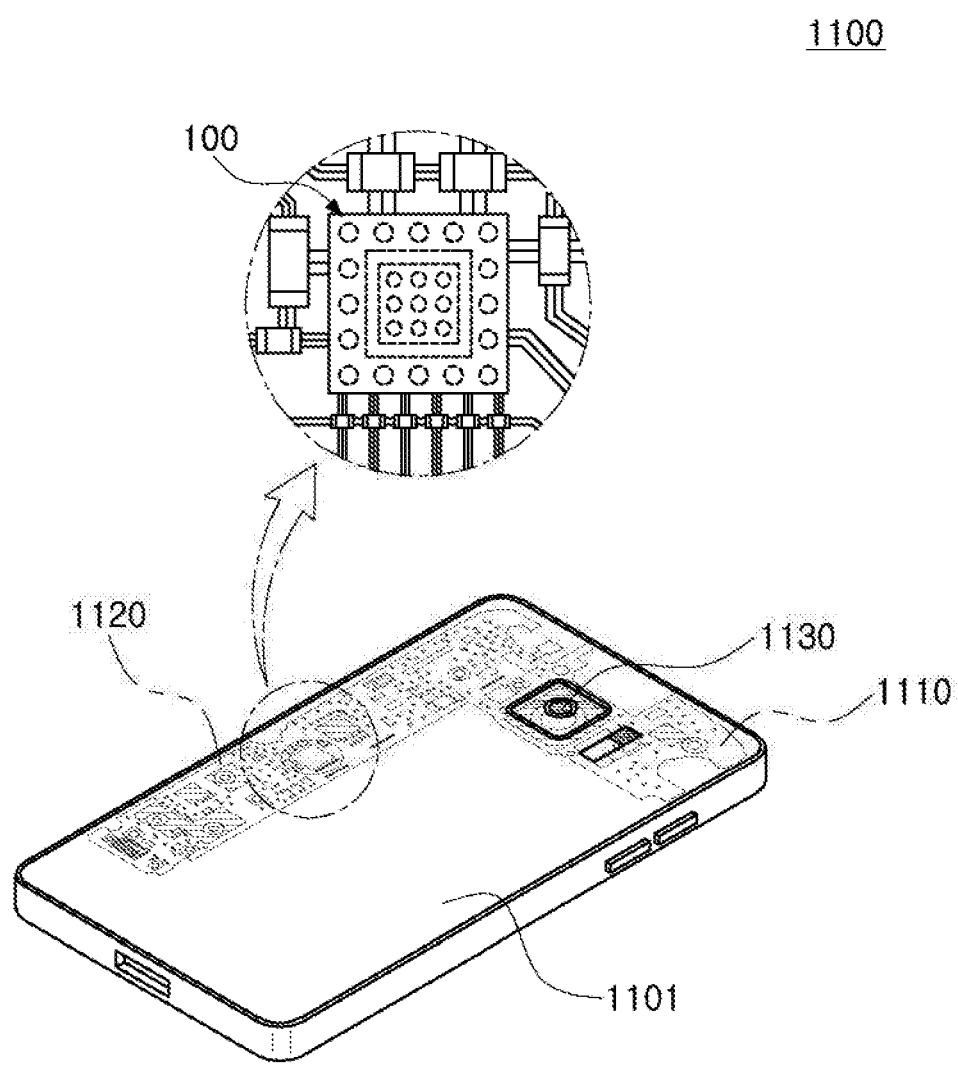
FIG. 2 schematically illustrates an example of an electronic component package applied to an electronic device.

FIG. 2 schematically illustrates an example of an electronic component package applied to an electronic device. The electronic component package may be used for various purposes in various electronic devices 1000 as described above. For example, a main board 1110 may be accommodated in a body 1101 of a smartphone 1100, and various electronic components 1120 may be physically and/or electrically connected to the main board 1110. Further, another component which may be or may not be physically and/or electrically connected to the main board 1110, such as a camera module 1130, may be accommodated in the body 1101. In this case, some of the electronic components 1120 may be the chip-related components as described above, and the electronic component package 100 may be, for example, an application processor among the chip-related components, but the electronic component 120 and the electronic component package 100 are not limited thereto.

Electronic Component Package

Figure 3:
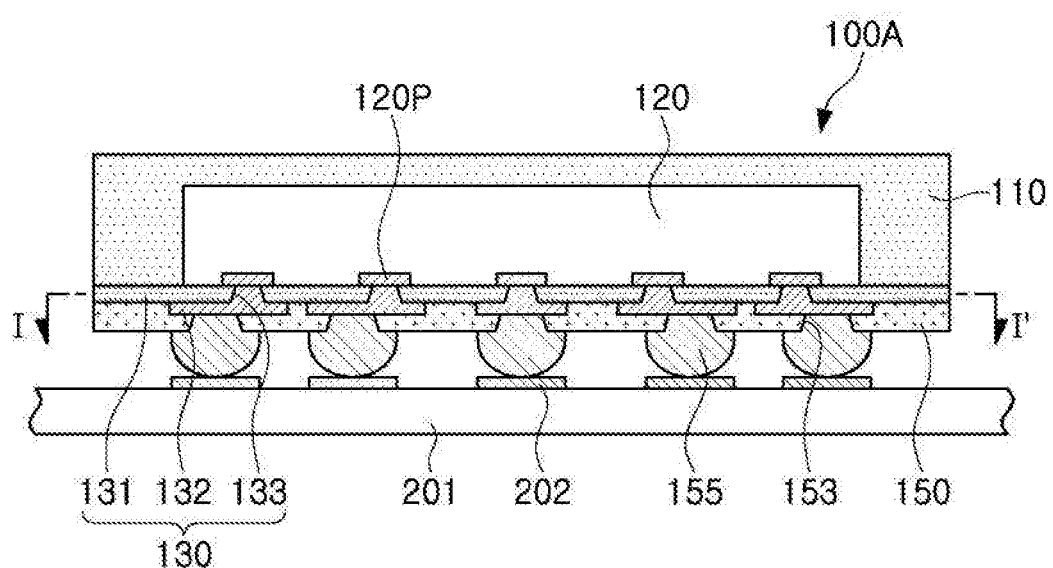
FIG. 3 is a cross-sectional diagram schematically illustrating an example of the electronic component package.

FIG. 3 is a cross-sectional diagram schematically illustrating an example of an electronic component package mounted on a board. Referring to FIG. 3, an electronic component package 100A according to an example may include a redistribution layer 130, an electronic component 120 disposed on the redistribution layer 130, and an encapsulant 110 encapsulating the electronic component 120. Further, the electronic component package 100A may include a passivation layer 150 disposed below the redistribution layer 130 and having an opening 153, and a connection terminal 155 disposed in the opening 153 of the passivation layer 150. The electronic component package 100A may be mounted on a board 201 through the connection terminal 155. The connection terminal 155 may be connected to a mounting pad 202 of the board 201. The electronic component package 100A may be mounted on the board 201 to thereby be used for various purposes in an electronic device. Here, the board 201 may be a main board of the electronic device having various circuit patterns, but is not limited thereto.

The encapsulant 110 may be a member for protecting the electronic component 120. A shape of the encapsulant encapsulating the electronic component 120 is not particularly limited, but the encapsulant may have any shape as long as the encapsulant at least partially encloses the electronic component 120. A specific material of the encapsulant 110 is not particularly limited. For example, an insulating material may be used as the material of the encapsulant 110.

Here, as the insulating material, a thermosetting resin such as an epoxy resin, a thermoplastic resin such as polyimide, resins in which a reinforcing material, such as glass fiber or an inorganic filler, is impregnated in the thermosetting resin and the thermoplastic resin, for example, a prepreg, an Ajinomoto build-up film (ABF), FR-4, a bismaleimide triazine (BT) resin, a photo imagable dielectric (PID) resin, or the like, may be used. Further, a molding material known in the art such as an epoxy molding compound (EMC), or the like, may also be used. If necessary, a conductive particle may be contained in the encapsulant 110 for shielding electromagnetic waves. Any conductive particle may be used as long as it may shield the electromagnetic waves. For example, the conductive particle may be formed of copper (Cu), aluminum (Al), silver (Ag), tin (Sn), gold (Au), nickel (Ni), lead (Pb), solder, or the like. However, these materials are only examples, and the conductive particle is not limited thereto.

The encapsulant 110 may be formed by a method known in the art. For example, the encapsulant 110 may be formed by laminating a precursor of the encapsulant 110 so as to capsulate the electronic component 120, and curing the laminated precursor. Alternatively, the encapsulant 110 may be formed by applying a material for forming the encapsulant 110 to an adhesion film, or the like, so as to capsulate the electronic component 120, and curing the applied material. As a method of laminating the precursor, for example, a method of performing hot pressing method of pressing an object at a high temperature for a predetermined time, cooling the object to room temperature while decompressed, and then separating a working tool in a cold press by cooling, or the like, may be used. As the method of applying the material, for example, a screen printing method of applying ink using a squeegee, a spray printing method of misting ink to apply the ink, or the like, may be used.

The electronic components 120 may be various active components (for example, a diode, a vacuum tube, a transistor, or the like) or passive components (for example, an inductor, a condenser, a resistor, or the like). Alternatively, the electronic component 120 may be an integrated circuit (IC) indicating a chip in which at least hundreds to millions or more of various elements are integrated. If necessary, the electronic component 120 may be an electronic component in which an integrated circuit is packaged in a form of a flip chip. The integrated circuit may be, for example, an application process chip such as a central processor (for example, a central processing unit (CPU)), a graphic processor (for example, a graphic processing unit (GPU)), a digital signal processor, a cryptographic processor, a micro processor, a micro controller, or the like, but is not limited thereto. A thickness of the electronic component 120 is not particularly limited and may be changed depending on the type of electronic component 120. For example, in a case in which the electronic component is the integrated circuit, the thickness of the electronic component 120 may be 100 μm to 480 μm, but is not limited thereto.

The electronic component 120 may have an electrode pad 120P electrically connected to the redistribution layer 130. The electrode pad 120P may be provided to electrically connect the electronic component 120 to the outside, and as a material for forming the electrode pad 120P, any conductive material may be used without particular limitation. Similarly, as the conductive material, copper (Cu), aluminum (Al), silver (Ag), tin (Sn), gold (Au), nickel (Ni), lead (Pb), alloys thereof, or the like, may be used, but the material for forming the electrode pad 120P is not limited thereto. The electrode pad 120P may be redistributed by the redistribution layer 130. The electrode pad 120P may be embedded or protrude. The electrode component 120 may be disposed so that the electrode pad 120P faces the redistribution layer 130. That is, the electronic component 120 may be disposed so that an active layer faces the redistribution layer 130.

In a case in which the electronic component 120 is the integrated circuit, the electrode component 120 may have a body (not denoted by a reference numeral), a passivation layer (not denoted by a reference numeral), and an electrode pad 120P. The body may be formed, for example, based on an active wafer. In this case, as a base material of the body, silicon (Si), germanium (Ge), gallium arsenide (GaAs), or the like, may be used. The passivation layer may serve to protect the body from the external environment and may be formed of an oxide film, a nitride film, or the like. Alternatively, the passivation layer may be formed of a double layer of an oxide film and a nitride film. As a material for forming the electrode pad 120P, a conductive material such as copper (Cu), aluminum (Al), silver (Ag), tin (Sn), gold (Au), nickel (Ni), lead (Pb), alloys thereof, or the like, may be used.

The redistribution layer 130 may be a configuration for redistributing the electrode pad 120P of the electronic component 120. Several tens to several hundred electrode pads 120P having various functions may be redistributed through the redistribution layer 130, and physically and/or electrically connected to the outside depending on the functions thereof through the connection terminal 155. The redistribution layer 130 may include a first insulating layer 131, a first conductive pattern 132 disposed on the first insulating layer 131, and a first via 133 connected to the first conductive pattern 132 while penetrating through the first insulating layer 131. The redistribution layer 130 may be a single layer as illustrated in FIG. 2, but is not limited thereto. That is, the redistribution layer 130 may be composed of a plurality of layers. A description thereof will be provided below.

The first insulating layer 131 may serve to protect the first conductive pattern 132 and the first via 133, and if necessary, the first insulating layer 131 may serve to insulate the first conductive pattern 132 and the first via 133. As a material forming the first insulating layer 131, an insulating material may be used. As the insulating material, a thermosetting resin such as an epoxy resin, a thermoplastic resin such as polyimide, resins in which a reinforcing material, such as a glass fiber or an inorganic filler, is impregnated in the thermosetting resin and the thermoplastic resin, for example, a prepreg, an Ajinomoto build-up film (ABF), FR-4, a bismaleimide triazine (BT) resin, or the like, may be used. In a case of using a photosensitive insulating material such as a photo imagable dielectric (PID) resin, the first insulating layer 131 may be formed to be reduced in thickness, and thus, the first via 133 having a fine pitch may be more easily implemented. A thickness of the first insulating layer 131 is not particularly limited. For example, the first insulating layer 131 may have a thickness of 5 μm to 20 μm or so. The first insulating layer 131 may be formed by a method known in the art. For example, the first insulating layer 131 may be formed by a method of laminating a precursor of the first insulating layer 131 and curing the laminated precursor, a method of applying a material for forming the first insulating layer 131 and curing the applied material, or the like, but is not limited thereto. As the method of laminating the precursor, for example, a method of performing a hot pressing method of pressing an object at a high temperature for a predetermined time, cooling the object to room temperature while decompressed, and then separating a working tool in a cold press by cooling, or the like, may be used. As the method of applying the material, for example, a screen printing method of applying ink using a squeeze, a spray printing method of misting ink to apply the ink, or the like, may be used. The curing may be drying the insulating material so as not to be completely cured in order to use a photolithography method, or the like, as a post process.

The first conductive pattern 132 may serve as a redistribution pattern, and as a material for forming the first conductive pattern 132, a conductive material such as copper (Cu), aluminum (Al), silver (Ag), tin (Sn), gold (Au), nickel (Ni), lead (Pb), alloys thereof, or the like, may be used. The first conductive pattern 132 may perform various functions depending on a design of the corresponding layer. For example, the first conductive pattern 132 may perform a role of a ground (GND) pattern, a power (PWR) pattern, a signal (S) pattern, or the like. Here, the signal (S) pattern may include various signal patterns, for example, a data signal pattern, or the like, except for the GND pattern, the PWR pattern, and the like. Further, the first conductive pattern 132 may perform roles of various pads such as a via pad, a connection terminal pad, and the like. In a case in which the first conductive pattern 132 is used as the pad, if necessary, a surface treatment layer may be further formed on a surface of the first conductive pattern 132. The surface treatment layer may be formed, for example, by electrolytic gold plating, electroless gold plating, organic solderablity preservative (OSP) surface treatment or electroless tin plating, electroless silver plating, electroless nickel plating/immersion gold plating, direct immersion gold (DIG) plating, hot air solder leveling (HASL), or the like. A thickness of the first conductive pattern 132 is not particularly limited. For example, the first conductive pattern 132 may have a thickness of 10 μm to 50 μm or so. The first conductive pattern 132 may be formed by a method known in the art. For example, the first conductive pattern 132 may be formed by electrolytic copper plating, electroless copper plating, or the like. In more detail, the first conductive pattern 132 may be formed by a method such as a chemical vapor deposition (CVD) method, a physical vapor deposition (PVD) method, a sputtering method, a subtractive method, an additive method, a semi-additive process (SAP), a modified semi-additive process (MSAP), or the like, but is not limited thereto.

The first via 133 may electrically connect the electrode pad 120P and the first conductive pattern 132 formed on different layers to each other, thereby forming an electrical path in the package 100A. As a material for forming the first via 133, a conductive material such as copper (Cu), aluminum (Al), silver (Ag), tin (Sn), gold (Au), nickel (Ni), lead (Pb), alloys thereof, or the like, may be used. The first via 133 may be completely filled with the conductive material, or be formed by forming the conductive material on a wall surface of a via hole. Further, as a shape of the first via 133, all shapes known in the art, such as a tapered shape of which a diameter is decreased downwardly, a reverse-tapered shape of which a diameter is increased downwardly, a cylindrical shape, and the like, may be applied. The first via 133 may be formed by a method known in the art. For example, the first via 133 may be formed using mechanical drilling and/or laser drilling. Alternatively, in a case in which the first insulating layer 131 contains a photosensitive material, the first via 133 may be formed by electrolytic copper plating, electroless copper plating, or the like, using a dry film pattern after forming a via hole using a photolithography method.

The passivation layer 150 may serve to protect the redistribution layer 130, or the like, and if necessary, the passivation layer 150 may serve to insulate the redistribution layer 130, and the like, from the outside. As a material forming the passivation layer 150, an insulating material may be used. As the insulating material, a solder resist known in the art may be used. That is, the passivation layer 150 may be a solder resist layer known in the art. In some cases, as a material for forming the passivation layer 150, the same material as that of the first insulating layer 131, for example, the same PID resin may be used. The passivation layer 150 may generally be a single layer, but may be configured as a plurality of layers, as needed. A thickness of the passivation layer 150 is not particularly limited. For example, a thickness of the passivation layer 150 except for the first conductive pattern 132 may be 5 μm to 20 μm or so, and in consideration of a thickness of the first conductive pattern 132, the passivation layer 150 may have a thickness of 15 μm to 70 μm or so. The passivation layer 150 may be formed by a method known in the art. For example, the passivation layer 150 may be formed by a method of laminating a precursor of the passivation layer 150 and curing the laminated precursor, a method of applying a material for forming the passivation layer 150 and curing the applied material, or the like, but is not limited thereto. As the method of laminating the precursor, for example, a method of performing hot pressing of pressing an object at a high temperature for a predetermined time, cooling the object to room temperature while decompressed, and then separating a working tool in a cold press by cooling, or the like, may be used. As the method of the material, for example, a screen printing method of applying ink using a squeegee, a spray printing method of misting ink to apply the ink, or the like, may be used. The curing may be drying the insulating material so as not to be completely cured in order to use a photolithography method, or the like, as a subsequent process.

The opening 153 of the passivation layer 150 may expose some of the first conductive patterns 132. In detail, the opening 153 may expose at least a portion of a pattern serving as the connection terminal pad among the first conductive patterns 132. The opening 153 may be a so-called solder mask defined (SMD) type opening or a so-called non-solder mask defined (NSMD) type opening. In some cases, the opening 153 may be a hybrid thereof. As a shape of the opening 153, a shape known in the art such as a circle, a polygon, or the like, may be applied. The opening 153 of the passivation layer 150 may be formed by a method known in the art. For example, the opening 153 may be formed using mechanical drilling and/or laser drilling or formed by a photolithography method.

The connection terminal 155 may be a configuration for physically and/or electrically connecting the electronic component package 100A to the outside. For example, the electronic component package 100A may be mounted on the main board of the electronic device through the connection terminal 155. The connection terminal 155 may be disposed in the opening 153 of the passivation layer 150 and connected to the first conductive pattern 132 opened through the opening 153. Therefore, the connection terminal 155 may be electrically connected to the electronic component 120. The connection terminal 155 may be formed of a conductive material, for example, copper (Cu), aluminum (Al), silver (Ag), tin (Sn), gold (Au), nickel (Ni), lead (Pb), solder, or the like. However, these materials are only examples, and the material of the connection terminal 155 is not limited thereto. The connection terminal 155 may be a land, a ball, a pin, or the like. However, in general, the connection terminal 155 may be a ball, for example, a solder ball. The connection terminal 155 may be formed as a multilayer or single layer structure. In a case in which the connection terminal 155 is formed as a multilayer structure, the connection terminal 155 may contain a copper pillar and solder, and in a case in which the connection terminal 155 is formed as a single layer structure, the connection terminal 155 may contain tin-silver solder or copper. However, these cases are only examples, and the connection terminal 155 is not limited thereto.

The connection terminal 155 may be disposed in a fan-in region and/or a fan-out region. The fan-in region means a region in which the electronic component is disposed, and the fan-out region means a region except for the region in which the electronic component is disposed. That is, the electronic component package 100A according to the example may be a fan-in package or a fan-out package. The specific number, interval, disposition shape, and the like, of the connection terminal 155 are not particularly limited, but may be sufficiently changed by a person skilled in the art depending on a design. For example, the number of connection terminals 155 may be several tens to several thousand, depending on the number of electrode pads 120P of the electronic component 120, but is not limited thereto. The number of connection terminal 155 may be more than or less than the above-mentioned range. The connection terminal 155 may be fixed by a reflow, and reliability may be improved by embedding a portion of the connection terminal 155 in the passivation layer 150 and exposing the other portion thereof to the outside in order to increase fixation force. In some cases, only the opening 153 may be formed, and the connection terminal 155 may be formed by a separate process as needed.

Figure 4A:
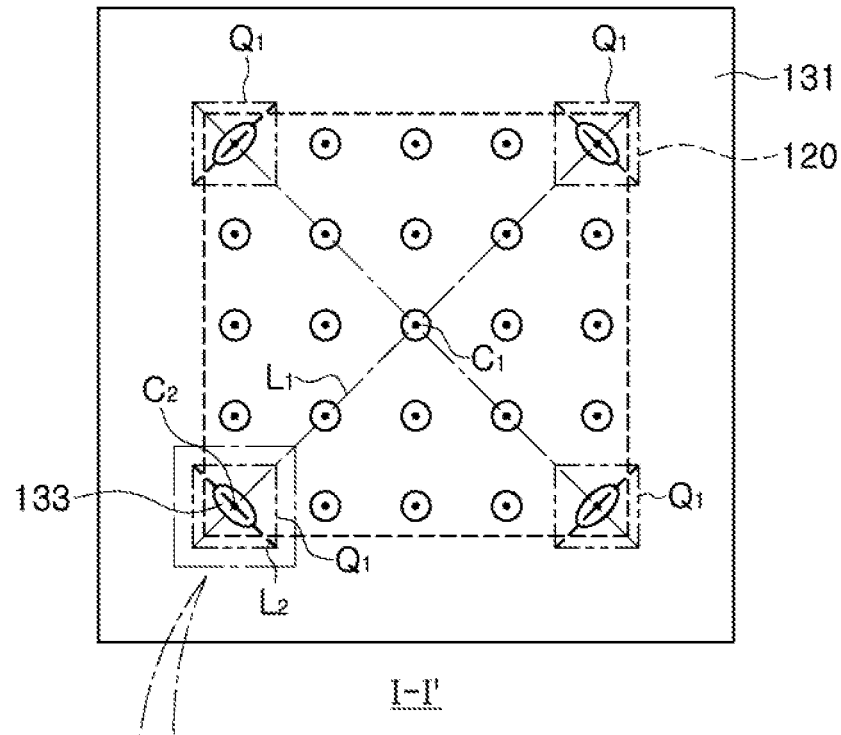
FIGS. 4A through 4C are cut-away plan views of the electronic component package taken along line I-I' of FIG. 3.
Figure 4B:
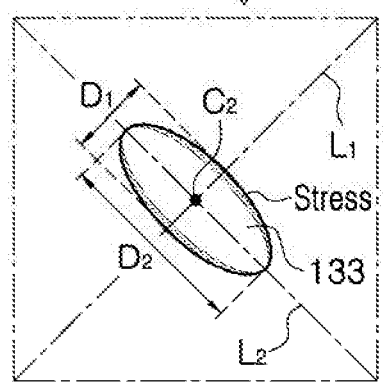
Figure 4C:
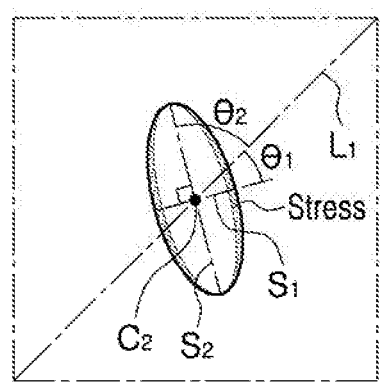
Figure 5A:
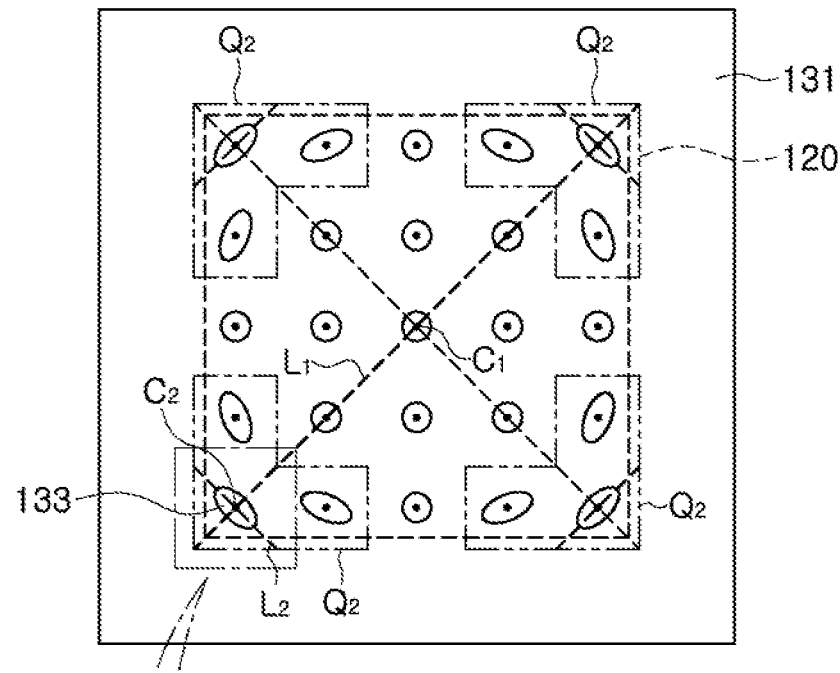
FIGS. 5A through 5C are cut-away plan views of the electronic component package taken along line I-I' of FIG. 3.
Figure 5B:
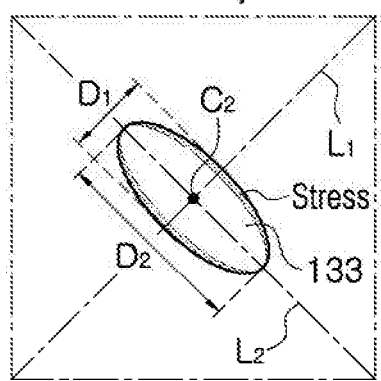
Figure 5C:
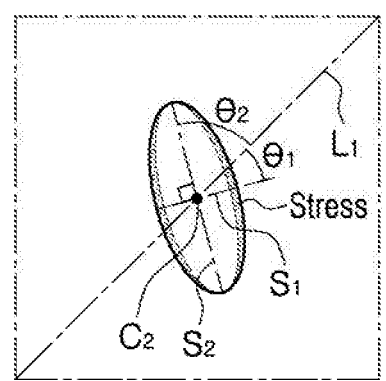
Figure 6A:
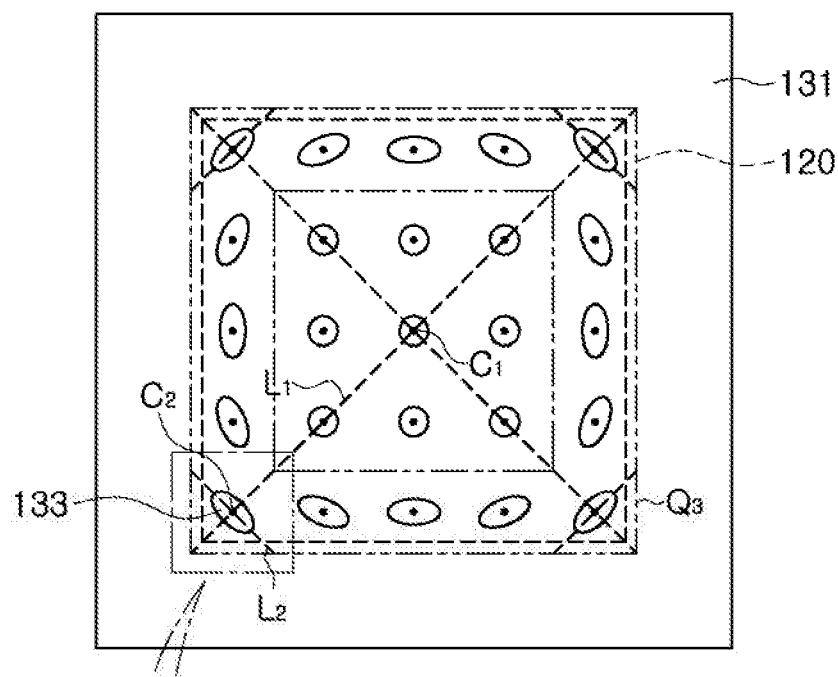
FIGS. 6A through 6C are cut-away plan views of the electronic component package taken along line I-I' of FIG. 3.
Figure 6B:
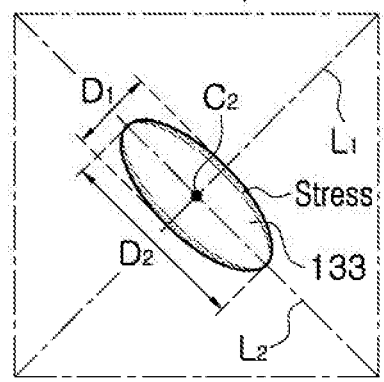
Figure 6C:
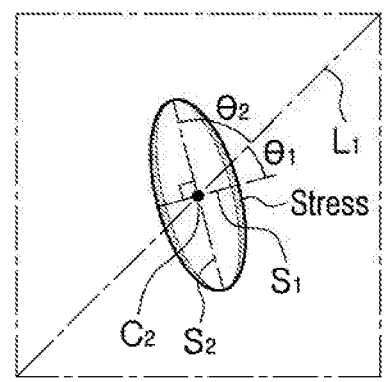
Figure 7A:
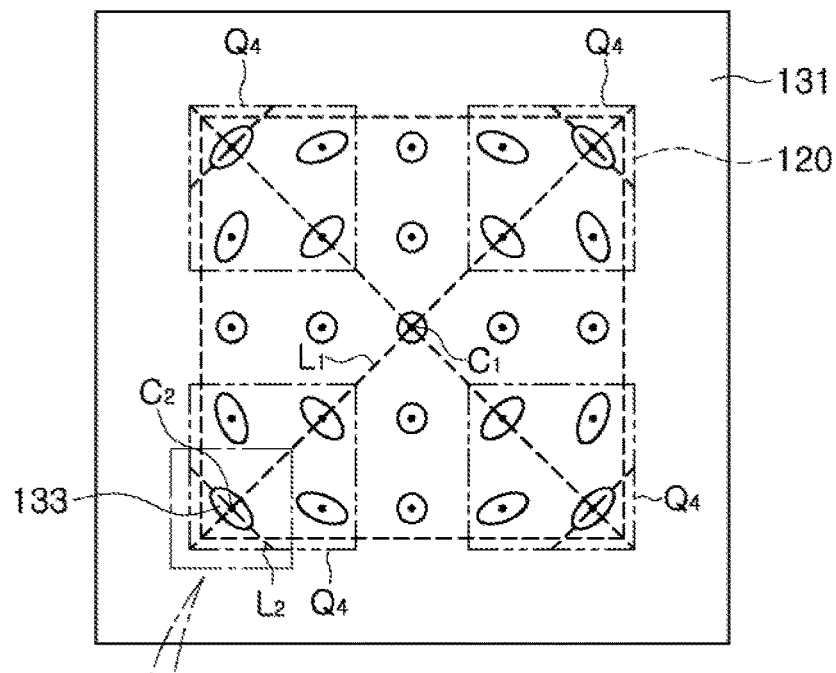
FIGS. 7A through 7C are cut-away plan views of the electronic component package taken along line I-I' of FIG. 3.
Figure 7B:
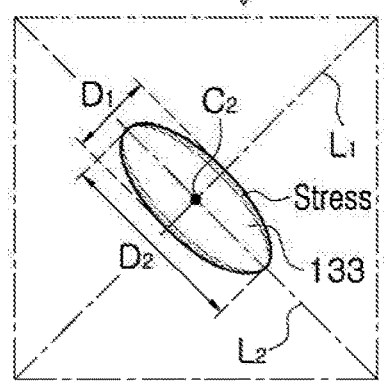
Figure 7C:
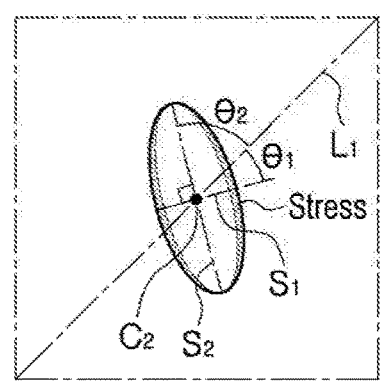

FIGS. 4A through 7C schematically illustrate various examples of a cut-away plan diagram of the electronic component package taken along line I-I' of FIG. 3. Referring to FIGS. 4A, 5A, 6A, and 7A, it may be appreciated that in the first via 133, stress is concentrated on a portion of the first via 133 facing a center of the electronic component package 100A and an opposite portion thereof. Therefore, in a case of increasing an area of the surface of the first via 133 on which stress is concentrated as compared to a case in which the first via 133 simply has a circular shape, stress applied to the first via 133 may be dispersed, and as a result, reliability may be improved. The stress as described above may be mainly concentrated on the via connected to the electrode pad 120P of the electronic component 120, and thus, it may be preferable that the first via 133 having a non-circular shape is the via connected to the electrode pad 120P of the electronic component 120. In this case, all of the vias connected to the electrode pads 120P of the electronic component 120 may be formed to have the non-circular shape as described above. However, reliability of the via may be improved as compared to the related art only by implementing the first via 133 connected to the electrode pad 120P disposed in a region on which the stress is mainly concentrated in the non-circular shape as described above. The region in which the stress is mainly concentrated may be changed depending on the applied package. For example, the region may be a corner Q1 of an outermost portion of the electronic component 120 as illustrated in FIG. 4A, a corner portion Q2 of an outermost portion of the electronic component 120 as illustrated in FIG. 5A, an outermost portion Q3 of the electronic component 120 as illustrated in FIG. 6A, or a corner portion Q4 of an outer portion of the electronic component 120 as illustrated in FIG. 7A, but is not limited thereto. Here, the outermost portion may mean an outermost region in which the via may be disposed, and the outer portion may mean an outer region including the outermost region as described above. Here, in a case in which it is difficult to clearly distinguish the outer region and an inner region from each other, that is, an intermediate region between the center and the outermost portion may be interpreted as being the outer region. Further, the corner may mean a vertex portion of some region in which the via may be disposed, and the corner portion may mean a corner portion expanded from the vertex portion so that a predetermined number of vias may be further disposed. Meanwhile, the non-circular shape is not particularly limited as long as the via has a horizontal cross-sectional shape in which a distance in a one direction is shorter than a distance in another direction perpendicular to the one direction as illustrated in the accompanying drawing. Here, the distance may be a distance of a virtual line connecting a center of the via and two arbitrary points on an edge of the via in horizontal cross section as illustrated in the accompanying drawings.

Meanwhile, referring to FIGS. 4B, 5B, 6B, and 7B, when the center of the electronic component package 100A is defined as C1 (see FIGS. 4A, 5A, 6A, and 7A), a center of the first via 133 is defined as C2, a virtual line connecting C1 and C2 is defined as L1, a virtual line perpendicular to L1 and passing through C2 is defined as L2, a distance between two points on the edge of the first via 133 at which the edge meets L1 is defined as D1, and a distance between two points on the edge of the first via 133 at which the edge meets L2 is defined as D2, the first via 133 having the non-circular shape may satisfy D1<D2. Since stress applied to the first via 133 is concentrated on the portion of the first via 133 facing the center of the electronic component package 100A and the opposite portion thereof as described above, it may be difficult to obtain a sufficient stress dispersion effect only by simply disposing the first via 133 having the non-circular shape. On the contrary, in a case of disposing the first via 133 having the non-circular shape to satisfy D1<D2, since a wide portion of the first via 133 having the non-circular shape is disposed to be close to the center of the electronic component package 100A, stress may be concentrated on the wide portion, thereby obtaining a more excellent stress dispersion effect.

Meanwhile, referring to FIGS. 4C, 5C, 6C, and 7C, when the center of the electronic component package 100A is defined as C1, the center of the first via 133 is defined as C2, the virtual line connecting C1 and C2 is defined as L1, an angle between a virtual line across distance S1 of the first via 133 in the first direction and L1 is defined as θ1, and an angle between a virtual line across distance S2 of the first via 133 in the second direction and L1 is defined as θ2, the first via 133 having the non-circular shape may satisfy θ1<θ2. Here, the distance S1 may be the shortest distance of any virtual line connecting a center of the via and any two arbitrary points on an edge of the via in horizontal cross section, and the distance S2, in the second direction perpendicular to the first direction determined by the virtual line having the distance S1, of a virtual line connecting the center of the via and two points on the edge of the via is greater than S1; or the distance S2 may be the longest distance of any virtual line connecting the center of the via and any two arbitrary points on the edge of the via in horizontal cross section, and the distance S1, in the first direction perpendicular to the second direction determined by the virtual line having the distance S2, of a virtual line connecting the center of the via and two points on the edge of the via is less than S2; or the distance S1 may be the shortest distance of any virtual line connecting the center of the via and any two arbitrary points on the edge of the via in horizontal cross section, the distance S2 may be the longest distance of any virtual line connecting the center of the via and any two arbitrary points on the edge of the via, and the first direction determined by the virtual line having the distance S1 and the second direction determined by the virtual line having the distance S2 may be perpendicular to each other. In a case in which θ1 is smaller than θ2, which means that the wide portion of the first via 133 having the non-circular shape is disposed to be close to the center of the electronic component package 100A similarly as described above, stress may be concentrated on the wide portion, thereby obtaining a more excellent stress dispersion effect. Unlike this, in a case in which θ1 is equal to or larger than θ2, which means that the wide portion of the first via 133 having the non-circular shape is disposed distantly from the center of the electronic component package 100A, stress may be concentrated on a narrow portion, such that there is a limitation in obtaining the above-mentioned stress dispersion effect. θ1 may be equal to 0.

Figure 8A:
FIGS. 8A through 8D schematically illustrate various examples of a non-circular via applied to the electronic component package of FIG. 3.
Figure 8B:
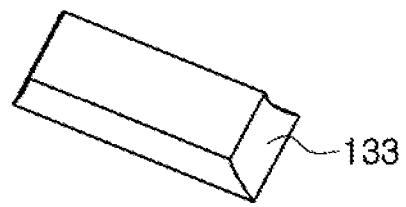
Figure 8C:
Figure 8D:
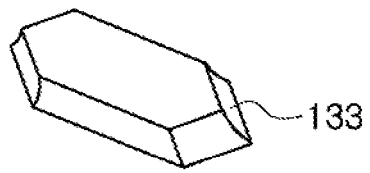

FIGS. 8A through 8D schematically illustrate various examples of a non-circular via applied to the electronic component package of FIG. 3. Referring to FIGS. 8A through 8D, a horizontal cross-section of the first via 133 having the non-circular shape may have an oval shape as illustrated in FIG. 8A, or a rectangular shape as illustrated in FIG. 8B. In addition, the horizontal cross-section of the first via 133 may have a diamond shape as illustrated in FIG. 8C, or a hexagonal shape as illustrated in FIG. 8D. However, these shapes are only examples suggested in order to describe the first via 133. That is, the first via 133 having the non-circular shape may have any shape in addition to the above-mentioned shapes as long as it may have the stress dispersion effect as described above.

Figure 9:
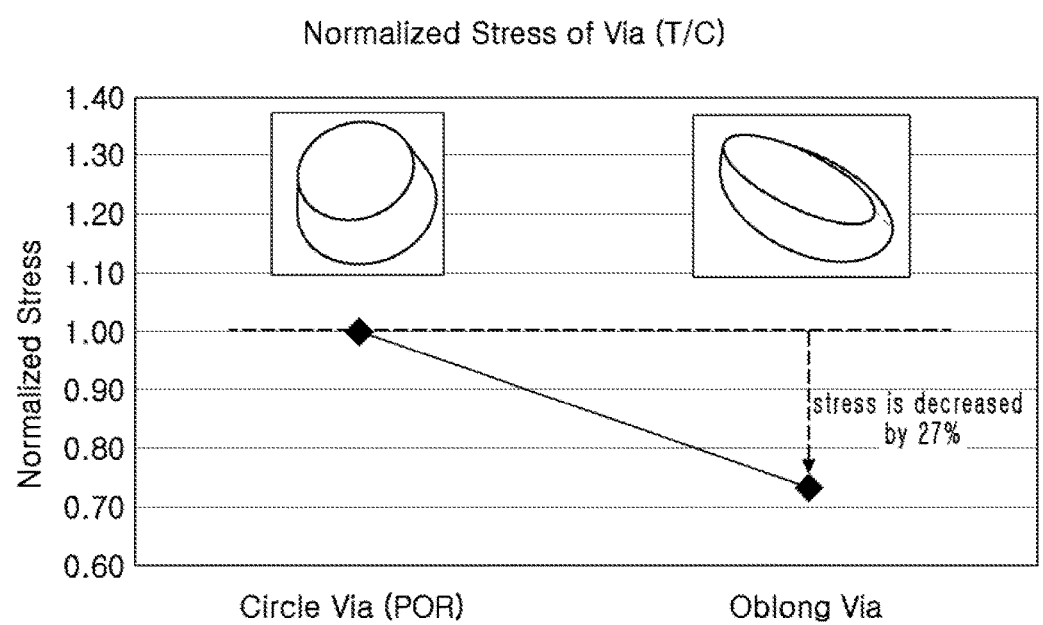
FIG. 9 schematically illustrates a decrease in stress of the non-circular via applied to the electronic component package of FIG. 3.

FIG. 9 schematically illustrates a stress decrease effect in a case of applying a non-circular via to the electronic component package of FIG. 3. The via used for interpreting the effect is the first via 133 connected to the electrode pad 120P disposed in the corner Q1 of the outermost portion of the electronic component package 120. It may be appreciated that in a case of disposing the non-circular via as described above, stress applied to the via is decreased as compared to a case of applying a circular via as in the related art. Therefore, it may be appreciated that reliability of the via is improved.

Figure 10:
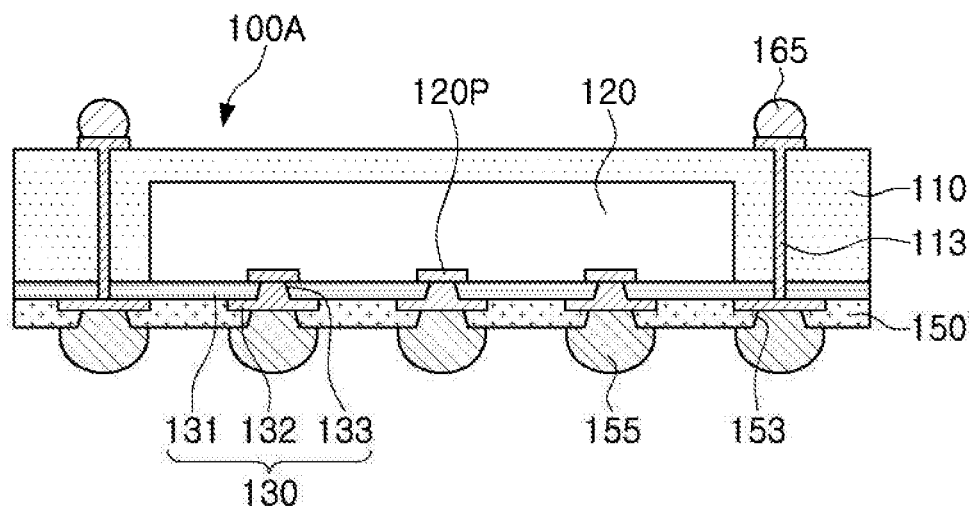
FIG. 10 is a cross-sectional diagram schematically illustrating a modified example of the electronic component package of FIG. 3.

FIG. 10 is a cross-sectional diagram schematically illustrating a modified example of the electronic component package of FIG. 3. Referring to FIG. 10, the electronic component package 100A according to the example may be a so-called package on package (PoP) type package. That is, the electronic component package 100A according to the example may further include a penetration wiring 113 penetrating through the encapsulant 110. Further, the electronic component package 100A may further include an upper connection terminal 165 connected to the penetration wiring 113. The other configurations are the same as described above.

When another package, a component for surface mount technology (SMT), or the like, is disposed on the package 100A, the penetration wiring 113 may serve to electrically connect them to the electronic component 120. As a material for forming the penetration wiring 113, a conductive material such as copper (Cu), aluminum (Al), silver (Ag), tin (Sn), gold (Au), nickel (Ni), lead (Pb), alloys thereof, or the like, may be used. The number, an interval, a disposition shape, and the like, of the penetration wiring 113 are not particularly limited, but may be sufficiently changed by a person skilled in the art depending on a design, and a detailed description thereof will be omitted. The penetration wiring 113 may be formed by a method known in the art. For example, the penetration wiring 113 may be formed using a mechanical drilling method and/or a laser drilling method, a sand blasting method using polishing particles, or a dry etching method using plasma. Alternatively, in a case in which the encapsulant 110 contains a photosensitive material, the penetration wiring 113 may be formed by electrolytic copper plating, electroless copper plating, or the like, using a dry film pattern after forming a hole for a penetration wiring using a photolithography method.

When another package, or the like, is disposed on the package 100A, the upper connection terminal 165 may serve as a connection unit for connecting the package 100A to another package, or the like. The upper connection terminal 165 may be formed of a conductive material, for example, copper (Cu), aluminum (Al), silver (Ag), tin (Sn), gold (Au), nickel (Ni), lead (Pb), solder, or the like. However, these materials are only examples, and the material of the upper connection terminal 165 is not limited thereto. The upper connection terminal 165 may be a land, a ball, a pin, or the like. However, in general, the upper connection terminal 165 may be a ball, for example, a solder ball. The upper connection terminal 165 may be formed as a multilayer or single layer structure. In a case in which the upper connection terminal 165 is formed as a multilayer structure, the upper connection terminal 165 may contain a copper pillar and solder, and in a case in which the upper connection terminal 165 is formed as a single layer structure, the upper connection terminal 165 may contain tin-silver solder or copper. However, these cases are only examples, and the upper connection terminal 165 isnot limited thereto. The upper connection terminal 165 may be formed using a method known in the art, and fixed by a reflow.

Figure 11:
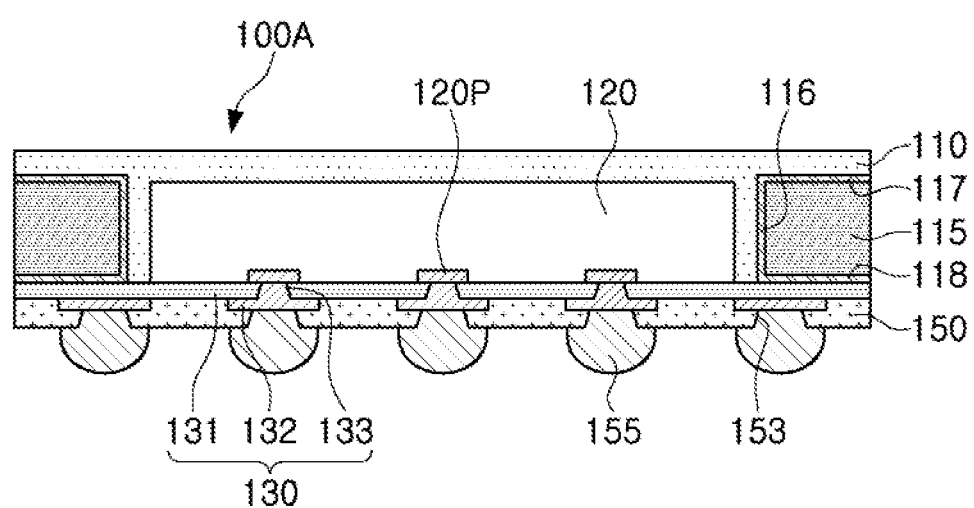
FIG. 11 is a cross-sectional diagram schematically illustrating a modified example of the electronic component package of FIG. 3.

FIG. 11 is a cross-sectional diagram schematically illustrating another modified example of the electronic component package of FIG. 3. Referring to FIG. 11, the electronic component package 100A according to the example may be a so-called panel level package (PLP) type package. That is, the electronic component package 100A according to the example may further include a frame 115 disposed on the redistribution layer 130 and having a through hole. In this case, the electronic component 120 may be disposed in the through hole of the frame 115. If necessary, metal layers 116, 117, and 118 may be disposed on an inner surface of the through hole of the frame 115, an upper surface of the frame 115, and/or a lower surface of the frame 115. The other configurations are the same as described above.

The frame 115 may be configured to support the package 100A, and due to the frame 115, rigidity may be maintained and thickness uniformity may be secured. The frame 115 may have the upper surface and the lower surface opposing the upper surface, and the through hole may be formed to penetrate between the upper and lower surfaces. The electronic component 120 may be disposed in the through hole to be spaced apart from the frame 115, and as a result, the frame 115 may enclose side surfaces of the electronic component 120. A material of the frame 115 is not particularly limited as long as it may support the package. For example, an insulating material may be used. Here, as the insulating material, a thermosetting resin such as an epoxy resin, a thermoplastic resin such as polyimide, or resins in which a reinforcing material, such as a glass fiber or an inorganic filler, is impregnated in the thermosetting resin and the thermoplastic resin, for example, a prepreg, ABF, FR-4, a BT resin, or the like, may be used. Alternatively, a metal having excellent rigidity and heat conductivity may be used. In this case, as the metal, an Fe—Ni based alloy may be used. Here, in order to secure adhesive force with a molding material, an interlayer insulating material, or the like, a Cu plating layer may be formed on a surface of the Fe—Ni based alloy. In addition, glass, ceramic, plastic, or the like, may be used. A thickness of the frame 115 in a cross-section thereof is not particularly limited and may be designed depending on a thickness of the electronic component 120 in a cross-section thereof. For example, the thickness of the frame 115 may be, for example, 100 μm to 500 μm or so depending on the kind of electronic component 120. In a case in which the package 100A has the frame 115, the package 100A may be manufactured by preparing the frame 115 having the through hole, disposing the electronic component 120 in the through hole using an adhesive film, or the like, forming the encapsulant 110, and then disposing the redistribution layer 130 as a subsequent process. The frame 115 may be a large sized frame 115 having a plurality of through holes for mass-production of the package 100A. A plurality of packages 100A may be manufactured as a single body using the frame 115 as described above, and may then be cut to form individual packages.

The metal layers 116, 117, and 118 disposed on the inner surface of the through hole of the frame 115, the upper surface of the frame 115, and/or the lower surface of the frame 115 as needed may be configurations for improving heat radiation characteristics and/or shielding electromagnetic waves. As a material forming the metal layers 116, 117, and 118, a metal having high heat conductivity, for example, copper (Cu), aluminum (Al), silver (Ag), tin (Sn), gold (Au), nickel (Ni), lead (Pb), alloys thereof, or the like, may be used without particular limitation. Heat radiated from the electronic component 120 may be dispersed toward an upper portion or lower portion of the frame 115 by conduction, radiation, and convection through the metal layers 116, 117, and 118. A formation method of the metal layers 116, 117, and 118 is not particularly limited, and the metal layers 116, 117, and 118 may be formed by a method known in the art. For example, the metal layers 116, 117, and 118 may be formed by electrolytic copper plating or electroless copper plating. More specifically, the metal layers 116, 117, and 118 may be formed by a method such as a CVD method, a PVD method, a sputtering method, a subtractive method, an additive method, a SAP method, a MSAP method, or the like, but the formation method of the metal layers 116, 117, and 118 is not limited thereto.

Figure 12:
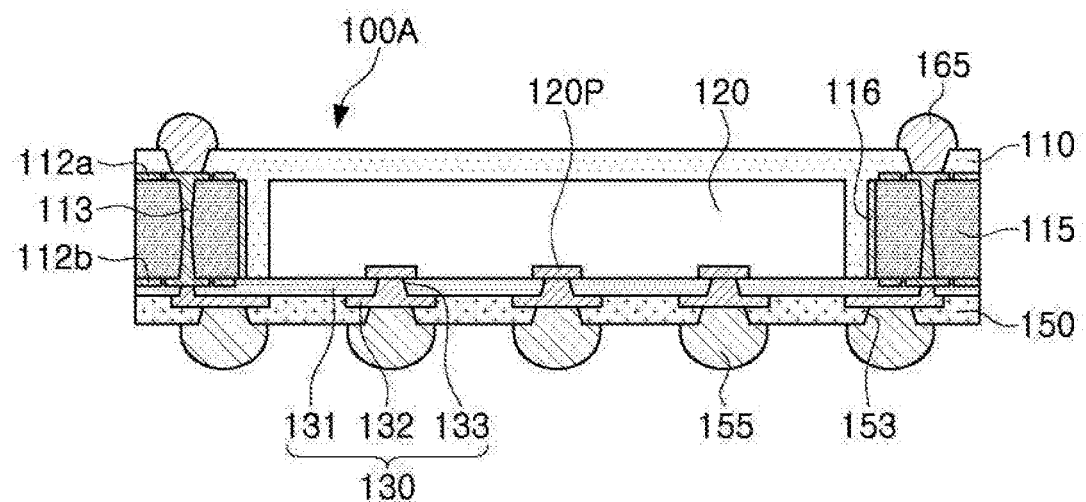
FIG. 12 is a cross-sectional diagram schematically illustrating a modified example of the electronic component package of FIG. 3.

FIG. 12 is a cross-sectional diagram schematically illustrating another modified example of the electronic component package of FIG. 3. Referring to FIG. 12, the electronic component package 100A according to the example may be simultaneously a so-called panel level package (PLP) type package and a so-called package on package (PoP) type package. That is, the electronic component package 100A according to the example may further include a penetration wiring 113 penetrating through a frame 115, wherein various conductive patterns 112a and 112b may be disposed on upper and lower surfaces of the frame 115, and if necessary, a metal layer 116 may be disposed on an inner surface of a through hole. Further, the electronic component package 100A may further include an upper connection terminal 165 connected to the penetration wiring 113. The other configurations are the same as those described above.

The penetration wiring 113 may only penetrate through the frame 115, and the specific number, an interval, a disposition shape, and the like, of penetration wirings 113 are not particularly limited, but may be sufficiently changed by a person skilled in the art depending on a design. In this case, the penetration wiring 113 may be formed by the method known in the art as described above. The upper connection terminal 165 may be disposed on an opening (not denoted by a reference numeral) formed on an upper surface of the encapsulant 110, and the specific number, an interval, a disposition shape, and the like, of the upper connection terminal 165 are not particularly limited, but may be sufficiently changed by a person skilled in the art depending on a design. In this case, the opening (not denoted by a reference numeral) and the upper connection terminal 165 may be formed by the method known in the art as described above.

Various conductive patterns 112a and 112b disposed on the upper and lower surfaces of the frame 115 may be a wiring pattern and/or a pad pattern, and since a wiring may be formed on the upper and lower surfaces of the frame 115 as described above, a wider routing region may be provided in the package 100A, and thus, a degree of freedom in a design of the redistribution layer 130 may be further improved. Various conductive patterns 112a and 112b may also be formed by the method known in the art as described above. The metal layer 116 disposed on the inner surface of the through hole of the frame 115 as needed may be a configuration for improving heat radiation characteristics and/or shielding electromagnetic waves, and in a case in which the metal layer 116 is only disposed on the inner surface of the through hole as described above, the metal layer 116 may have a sufficient heat radiation effect and a sufficient electromagnetic wave shielding effect. The metal layer 116 may also be formed by the method known in the art as described above.

Figure 13:
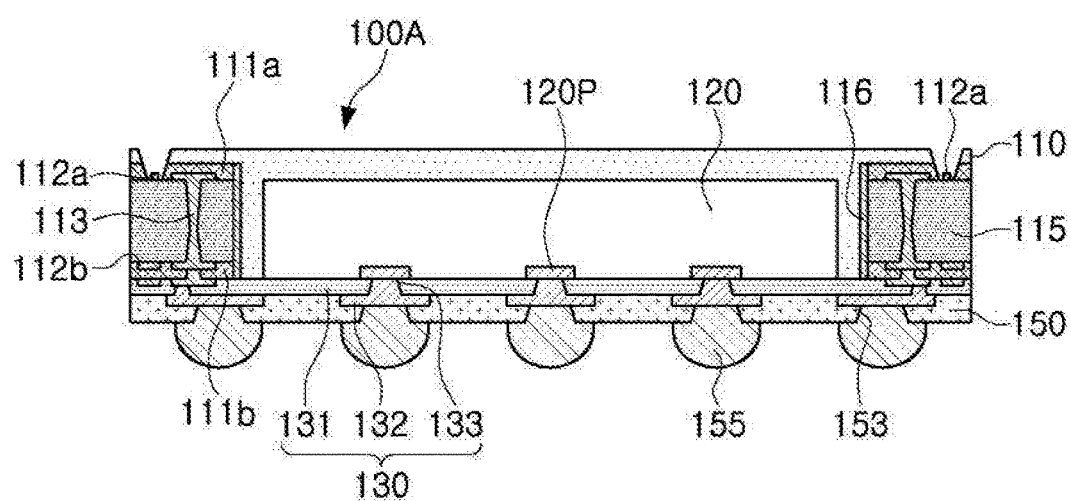
FIG. 13 is a cross-sectional diagram schematically illustrating a modified example of the electronic component package of FIG. 3.

FIG. 13 is a cross-sectional diagram schematically illustrating another modified example of the electronic component package of FIG. 3. Referring to FIG. 13, the electronic component package 100A according to the example may be simultaneously a so-called panel level package (PLP) type package and a so-called package on package (PoP) type package. That is, internal insulating layers 111a and 111b having through holes integrated with a through hole of a frame 115 may be further disposed on an upper surface and/or a lower surface of the frame 115. An opening (not denoted by a reference numeral) penetrating up to the encapsulant 110 may be formed in a first internal insulating layer 111a, such that a pattern 112a may be partially exposed externally through the opening. The exposed pattern 112a may serve as a pad of a wire bonding of an electronic component having different shape or an electronic component package, disposed on the package 100A. Other configurations are the same as described above.

The first internal insulating layers 111a and 111b may be to form a larger number of wiring patterns before disposing the electronic component 120. As the number of first internal insulating layers 111a and 111b is increased, the number of wiring patterns formed on the corresponding layers may be increased, such that the number of redistribution layers 130 may be decreased. As a result, a probability that the electronic component 120 will not be used due to defects occurring during forming the redistribution layer 130 after disposing the electronic component 120 may be decreased. That is, a problem of a decrease in yield due to process defects after disposing the electronic component 120 may be prevented. The through holes penetrating through the first insulating layers 111a and 111b may also be formed in the first internal insulating layers 111a and 111b, and may be integrated with the through hole penetrating through the frame 110. In this case, the electronic component 120 may be disposed in the integrated through hole. Various conductive patterns and vias (not denoted by a reference numeral) may be formed in the first internal insulating layers 111a and 111b. A formation method thereof is the same as described above.

As a material of the first insulating layers 111a and 111b, an insulating material may be used. Here, as the insulating material, a thermosetting resin such as an epoxy resin, a thermoplastic resin such as polyimide, or resins in which a reinforcing material, such as a glass fiber or an inorganic filler, is impregnated in the thermosetting resin and the thermoplastic resin, for example, a prepreg, ABF, FR-4, a BT resin, or the like, may be used. In a case of using a photosensitive insulating material such as a photosensitive insulating resin, the insulating layers 111a and 111b may be formed to be thinner, and it may be easy to implement a fine pitch. Insulating materials contained in each of the first internal insulating layers 111a and 111b may be the same as or different from each other. Further, thicknesses of the first internal insulating layers 111a and 111b may be approximately the same as or different from each other. In a case in which the materials of the first internal insulating layers 111a and 111b are the same as each other, the thicknesses thereof are substantially the same as each other, and the numbers of layers thereof are the same as each other, the first internal insulating layers 111a and 111b may be symmetrical to each other based on the frame 115. In this case, it may be easier to control warpage.

Figure 14:
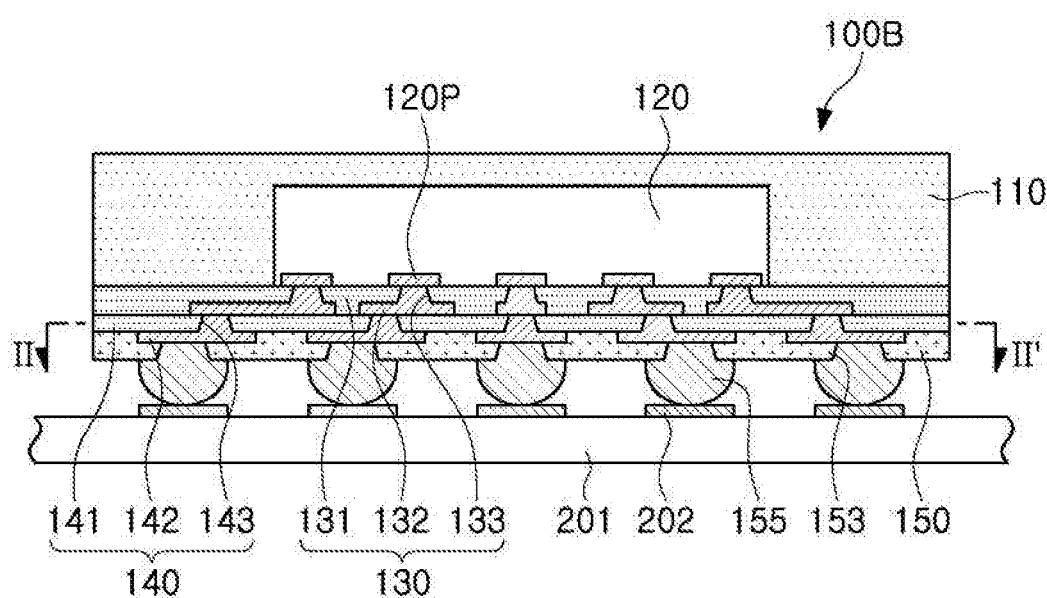
FIG. 14 is a cross-sectional diagram schematically illustrating another example of the electronic component package.

FIG. 14 is a cross-sectional diagram schematically illustrating another example of an electronic component package mounted on a board. Referring to FIG. 14, similarly, an electronic component package 100B according to another example may include redistribution layers 130 and 140, an electronic component 120 disposed on the redistribution layers 130 and 140, and an encapsulant 110 encapsulating the electronic component 120. Further, the electronic component package 100B may include a passivation layer 150 disposed below the redistribution layers 130 and 140 and having an opening 153, and a connection terminal 155 disposed in the opening 153 of the passivation layer 150. The electronic component package 100B may be mounted on a board 201 through the connection terminal 155. However, the redistribution layers 130 and 140 may be composed of a plurality of layers. Hereinafter, configurations of the electronic component package 100B according to another example will be described, but descriptions of configurations overlapping the configuration described above will be omitted, and only added components will be described.

The redistribution layer 140 may include a second insulating layer 141 disposed on a first insulating layer 131, a second conductive pattern 142 disposed on the second insulating layer 141, and a second via 143 connecting first and second conductive patterns 132 and 142 to each other while penetrating through the second insulating layer 141. The redistribution layer 140 may also be a multilayer structure composed of a larger number of layers as illustrated in FIG. 14. Since a content of the added redistribution layer is the same as described above, a description thereof will be omitted.

The second insulating layer 141 may serve to protect the second conductive pattern 142, the second via 143, and the like, and if necessary, the second insulating layer 141 may serve to insulate the second conductive pattern 142 and the second via 143. As a material for forming the second insulating layer 141, an insulating material may be used. As the insulating material, a thermosetting resin such as an epoxy resin, a thermoplastic resin such as polyimide, or resins in which a reinforcing material, such as a glass fiber or an inorganic filler, is impregnated in the thermosetting resin and the thermoplastic resin, for example, a prepreg, ABF, FR-4, a BT resin, or the like, may be used. In a case of using a photosensitive insulating material such as a photoimagable dielectric (PID) resin, the second insulating layer 141 may be formed to be thinner, and thus, the second via 143 having a fine pitch may be more easily implemented. A thickness of the second insulating layer 141 is not particularly limited. For example, a thickness of the second insulating layer 141 except for the second conductive pattern 142 may be 5 μm to 20 μm or so, and in consideration of a thickness of the second conductive pattern 142, the second insulating layer 141 may have a thickness of 15 μm to 70 μm or so. The second insulating layer 141 may be formed by a method known in the art. For example, the second insulating layer 141 may be formed by a method of laminating a precursor of the second insulating layer 141 and curing the laminated precursor, a method of applying a material for forming the second insulating layer 141 and curing the applied material, or the like, but is not limited thereto. As the method of laminating the precursor, for example, a method of performing a hot pressing method of pressing an object at a high temperature for a predetermined time, cooling the object to room temperature while decompressed, and then separating a working tool in a cold press by cooling, or the like, may be used. As the method of applying the material, for example, a screen printing method of applying ink using a squeegee, a spray printing method of misting ink to apply the ink, or the like, may be used. The curing may include drying the insulating material so as not to be completely cured in order to use a photolithography method, or the like, as a subsequent process.

The second conductive pattern 142 may serve as a redistribution pattern, and as a material for forming the second conductive pattern 142, a conductive material such as copper (Cu), aluminum (Al), silver (Ag), tin (Sn), gold (Au), nickel (Ni), lead (Pb), alloys thereof, or the like, may be used. The second conductive pattern 142 may perform various functions depending on a design of the corresponding layer. For example, the second conductive pattern 142 may perform a role of a ground (GND) pattern, a power (PWR) pattern, a signal (S) pattern, or the like. Here, the signal (S) pattern may include various signal patterns, for example, a data signal pattern, or the like, except for the GND pattern, the PWR pattern, and the like. Further, the second conductive pattern 142 may perform roles of various pads such as a via pad, a connection terminal pad, and the like. In a case in which the second conductive pattern 142 is used as the pad, if necessary, a surface treatment layer may further be formed on a surface of the second conductive pattern 142. The surface treatment layer may be formed, for example, by electrolytic gold plating, electroless gold plating, an organic solderablity preservative (OSP) surface treatment or electroless tin plating, electroless silver plating, electroless nickel plating/immersion gold plating, direct immersion gold (DIG) plating, hot air solder leveling (HASL), or the like. A thickness of the second conductive pattern 142 is not particularly limited. For example, the second conductive pattern 142 may have a thickness of 10 μm to 50 μm or so. The second conductive pattern 142 may be formed by a method known in the art. For example, the second conductive pattern 142 may be formed by electrolytic copper plating, electroless copper plating, or the like. In more detail, the second conductive pattern 142 may be formed by a method such as CVD method, a PVD method, a sputtering method, a subtractive method, an additive method, a SAP method, a MSAP method, or the like, but the formation method of the second conductive pattern 142 is not limited thereto.

The second via 143 may electrically connect the first and second conductive patterns 132 and 142 formed on different layers to each other, thereby forming an electrical path in the package 100B. As a material for forming the second via 143, a conductive material such as copper (Cu), aluminum (Al), silver (Ag), tin (Sn), gold (Au), nickel (Ni), lead (Pb), alloys thereof, or the like, may be used. The second via 143 may be completely filled with the conductive material, or be formed by forming the conductive material on a wall surface of a via hole. Further, as a shape of the second via 143, all shapes known in the art, such as a tapered shape of which a diameter is decreased downwardly, a reverse-tapered shape of which a diameter is increased downwardly, a cylindrical shape, and the like, may be applied. The second via 143 may be formed by a method known in the art. For example, the second via 143 may be formed using mechanical drilling and/or laser drilling. Alternatively, in a case in which the second insulating layer 141 contains a photosensitive material, the second via 143 may be formed by electrolytic copper plating, electroless copper plating, or the like, using a dry film pattern after forming a via hole using a photolithography method.

Figure 15A:
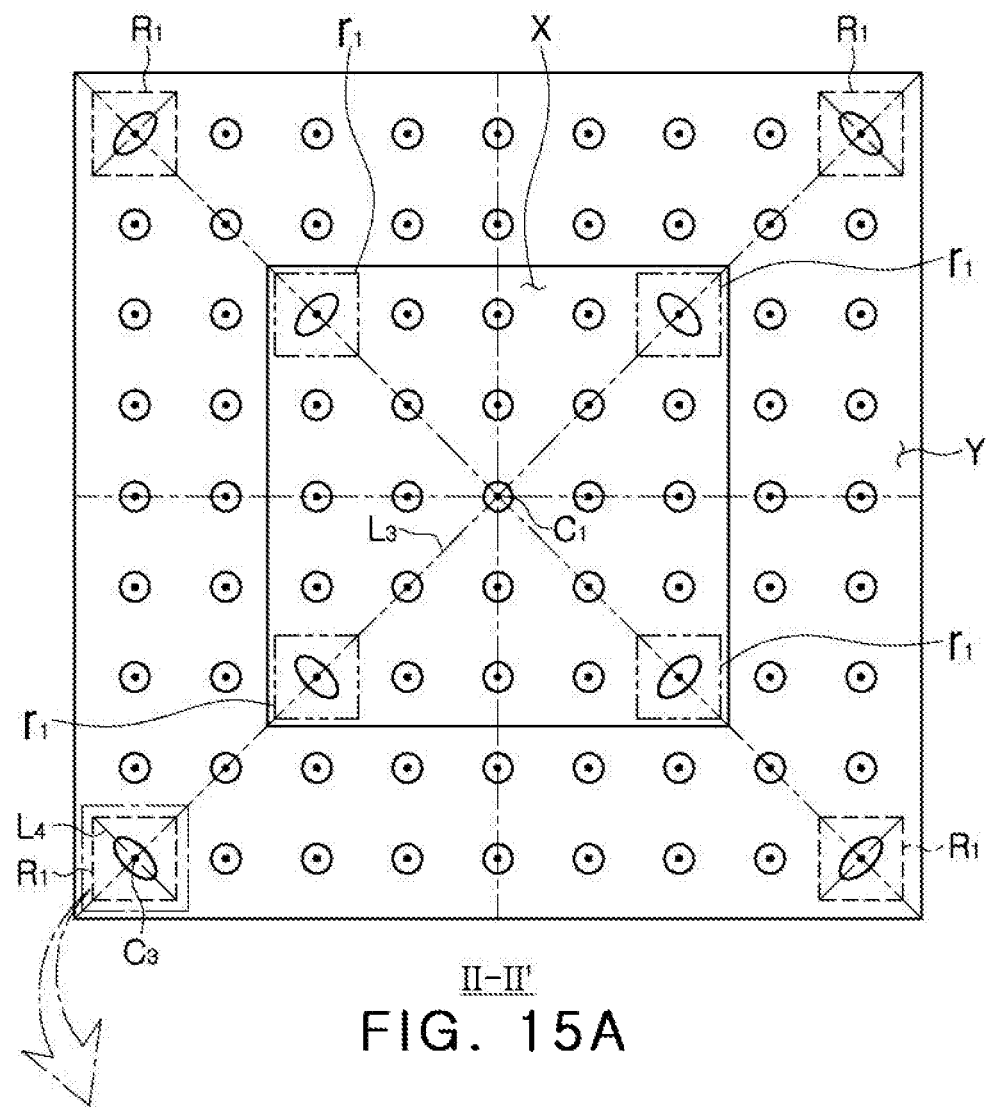
FIGS. 15A through 15C are cut-away plan views of the electronic component package taken along line II-II' of FIG. 14.
Figure 15B:
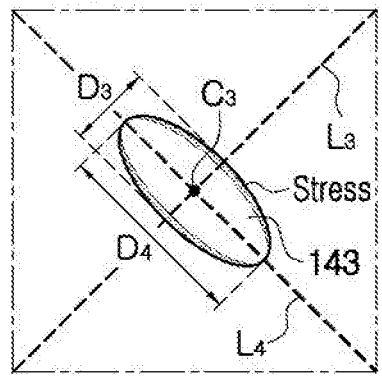
Figure 15C:
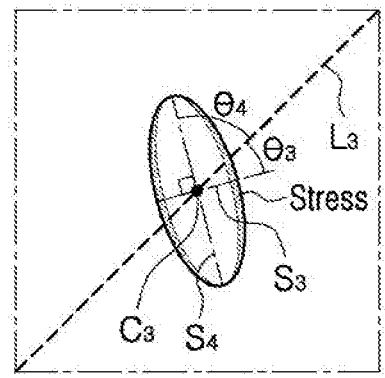
Figure 16A:
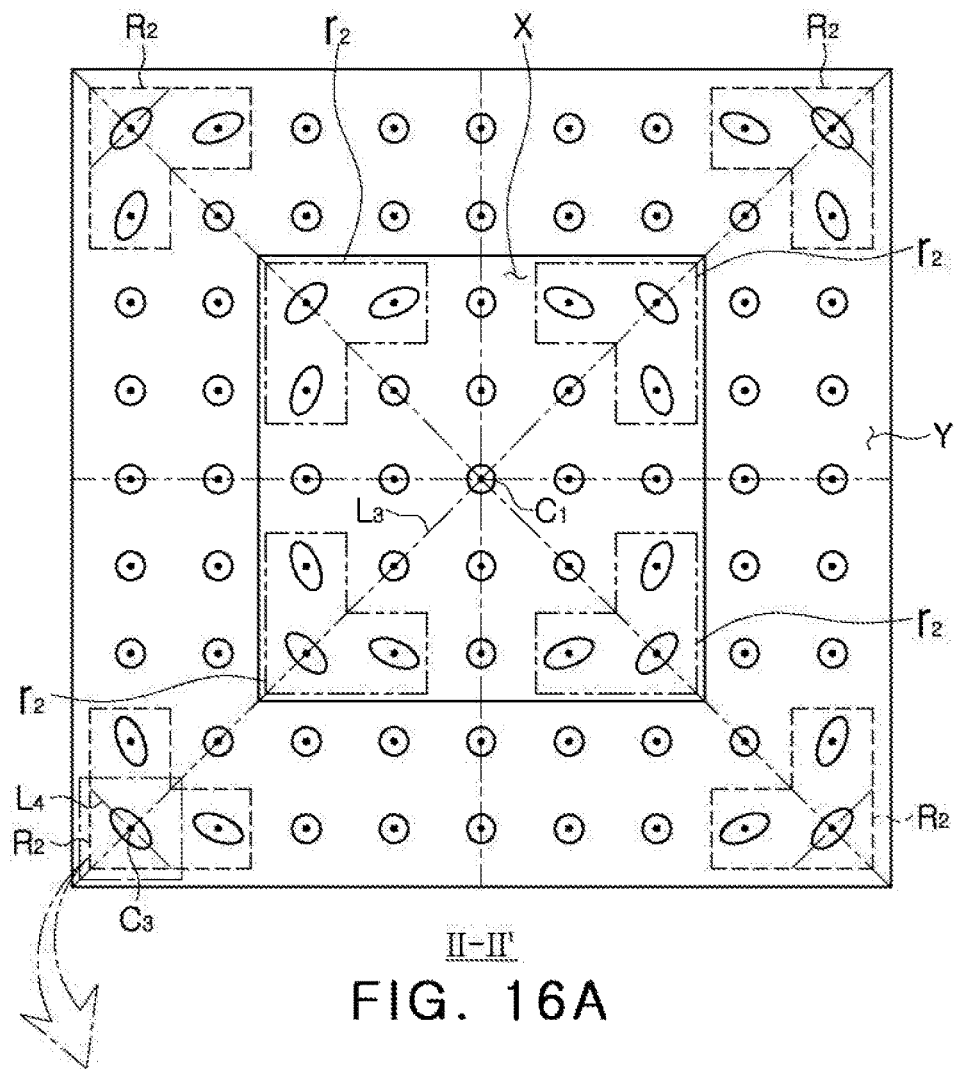
FIGS. 16A through 16C are cut-away plan views of the electronic component package taken along line II-II' of FIG. 14.
Figure 16B:
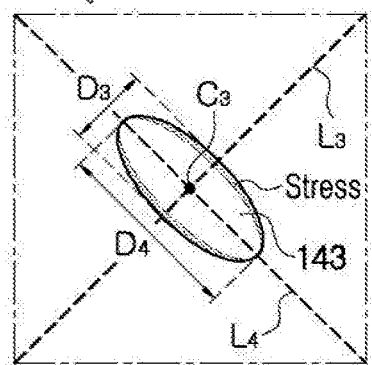
Figure 16C:
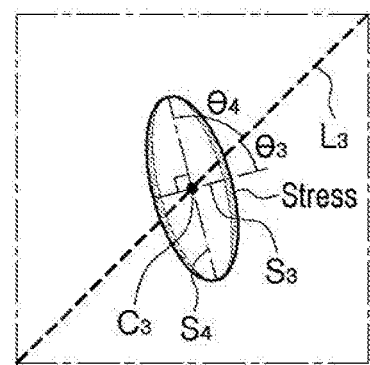
Figure 17A:
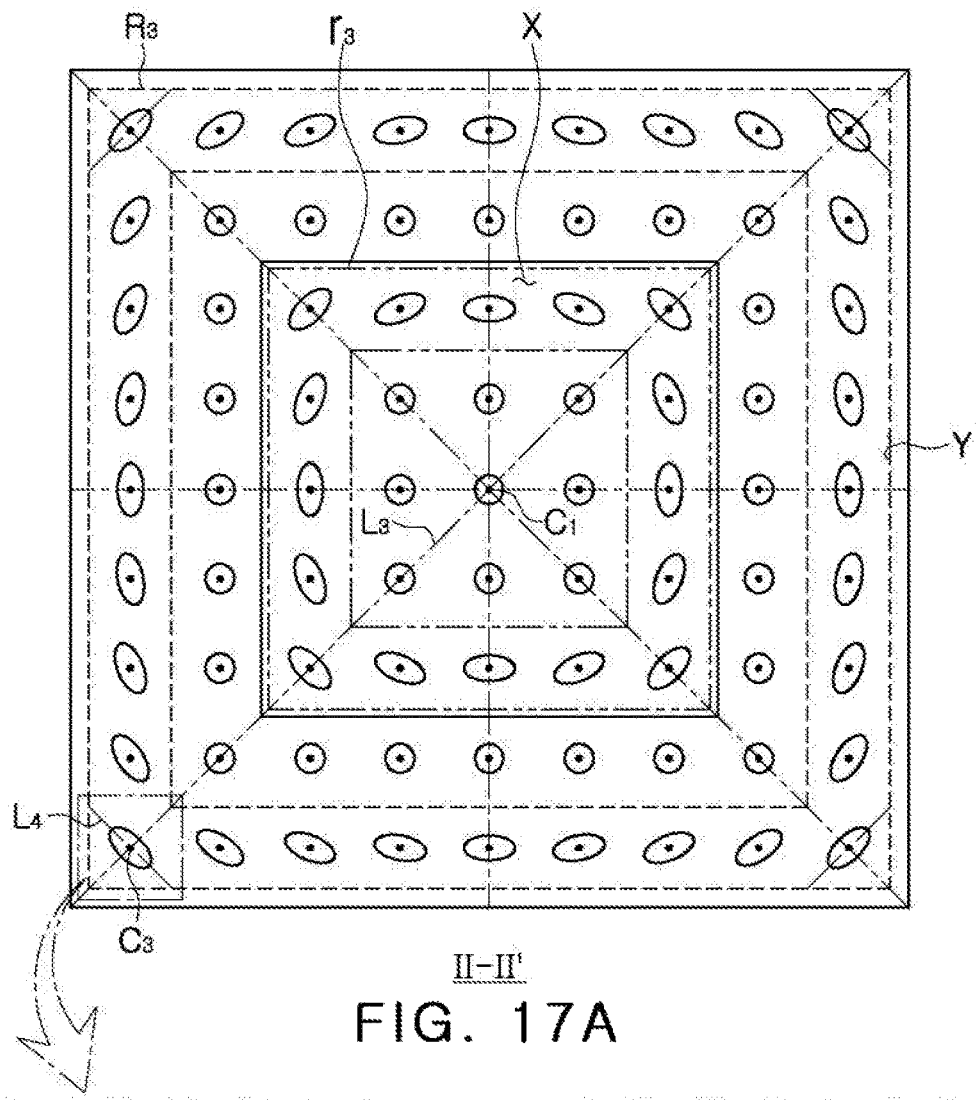
FIGS. 17A through 17C are cut-away plan views of the electronic component package taken along line II-II' of FIG. 14.
Figure 17B:
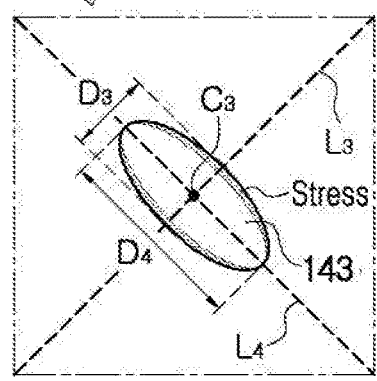
Figure 17C:
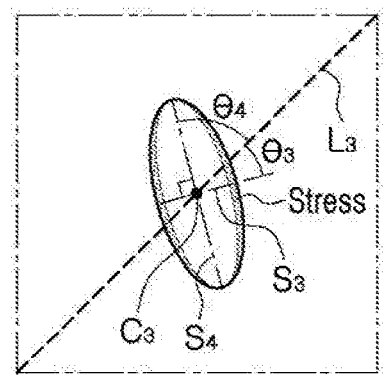
Figure 18A:
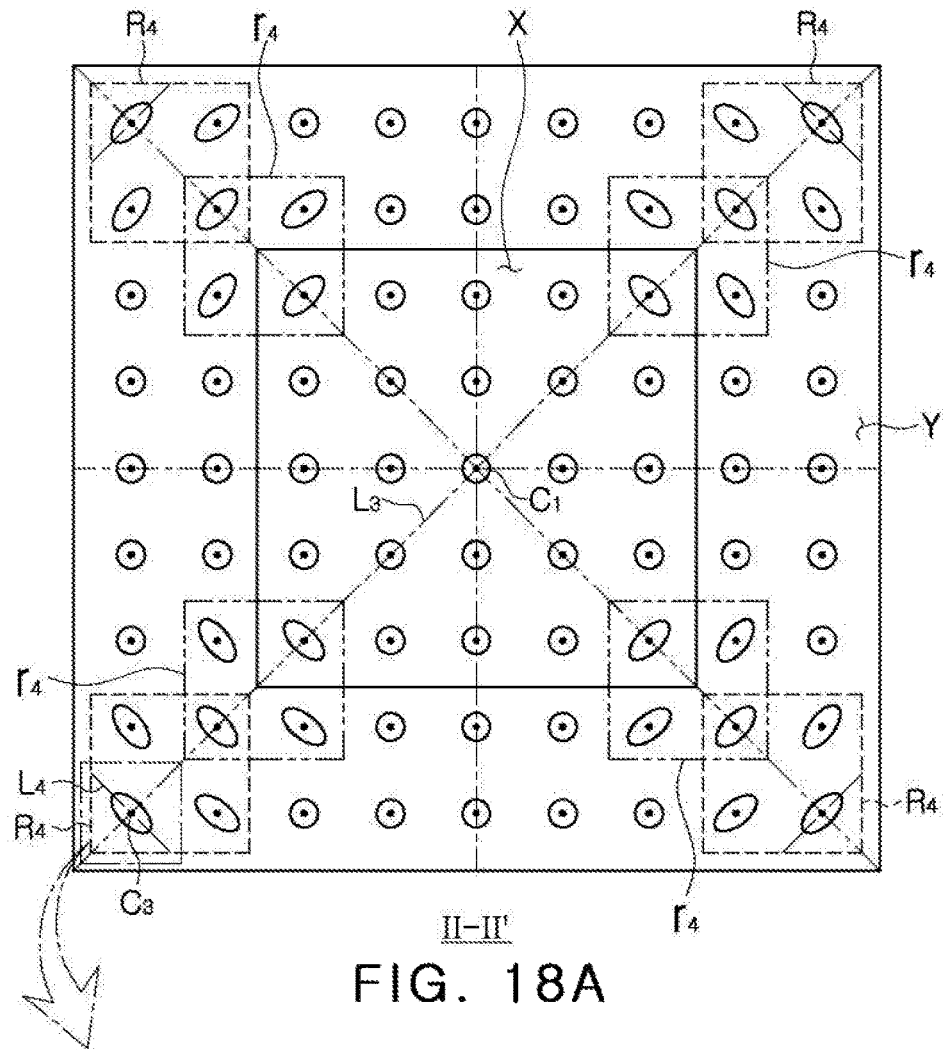
FIGS. 18A through 18C are cut-away plan views of the electronic component package taken along line II-II' of FIG. 14.
Figure 18B:
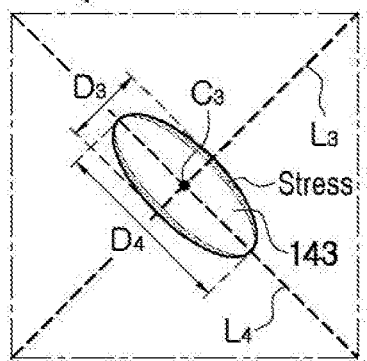
Figure 18C:
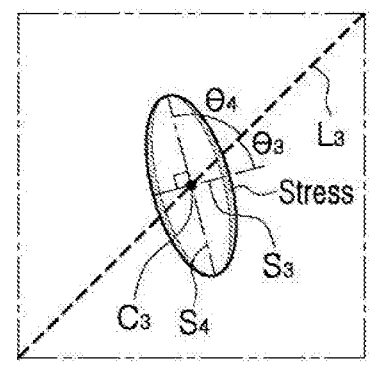

FIGS. 15A through 18C schematically illustrate various examples of a cut-away plan diagram of the electronic component package taken along line II-II' of FIG. 14. Referring to FIGS. 15A, 16A, 17A, and 18A, it may be appreciated that in the second via 142 connecting the conductive patterns 132 and 142 disposed on different layers to each other, stress is also concentrated on a portion of the second via 143 facing a center of the electronic component package 100B and an opposite portion thereof. Therefore, in a case of increasing an area of the portion of the second via 143 on which stress is concentrated as compared to a circular shape according to the related art as described above, stress may be dispersed, and as a result, reliability may be improved as compared to a case in which the second via simply has a circular shape. In this case, all of the vias may be formed to have the non-circular shape as described above, but reliability of the via may be improved as compared to the related art only by forming the second via 143 disposed in a region on which stress is mainly concentrated to have the non-circular shape as described above. The region on which stress is mainly concentrated may be changed depending on the applied package. For example, when a region of the redistribution layer 140 corresponding to a region in which the electronic component 120 is disposed is defined as a first region X, and a region enclosing the first region X is defined as a second region Y, the region on which the stress is mainly concentrated may be a corner r1 of an outermost portion of the first region X and/or a corner R1 of an outermost portion of the second region Y as illustrated in FIG. 15A, a corner portion r1 of an outermost portion of the first region X and/or a corner portion R2 of an outermost portion of the second region Y as illustrated in FIG. 16A, an outermost portion r3 of the first region X and/or an outermost portion R3 of the second region Y as illustrated in FIG. 17A, or a corner of an outermost portion of the first region X and a portion r4 of the second region Y enclosing the corner of the outermost portion of the first region and/or a corner portion R4 of an outer portion of the second region Y as illustrated in FIG. 18A. However, the region on which stress is mainly concentrated is not limited thereto. Here, the outermost portion may mean an outermost region in which the via may be disposed, and the outer portion may mean an outer region including the outermost region as described above. Here, in a case in which it is difficult to clearly distinguish the outer region and an inner region from each other, an intermediate region between the center and the outermost portion may be interpreted as the outer region. Further, the corner may mean a vertex portion of some region in which the via may be disposed, and the corner portion may mean a corner portion expanded from the vertex portion so that a predetermined number of vias may be further disposed. Meanwhile, the non-circular shape is not particularly limited as long as the via has a horizontal cross-sectional shape in which a distance S3 in a first direction is shorter than a distance S4 in a second direction perpendicular to the first direction.

Meanwhile, referring to FIGS. 15B, 16B, 17B, and 18B, when the center of the electronic component package 100B is defined as C1, a center of the second via 143 is defined as C3, a line connecting C1 and C3 to each other is defined as L3, a virtual line perpendicular to L3 and passing through C3 is defined as L4, a distance between two points on an edge of the second via 143 at which the edge meets L3 is defined as D3, and a distance between two points on the edge of the second via 143 at which the edge meets L4 is defined as D4, the second via 143 having the non-circular shape may satisfy D3<D4. Since stress applied to the second via 143 is concentrated on the portion of the second via 143 facing the center of the electronic component package 100B and the opposite portion thereof as described above, it may be difficult to sufficiently disperse stress only by simply disposing the second via 143 having the non-circular shape. On the contrary, in a case of disposing the second via 143 having the non-circular shape to satisfy D3<D4, since a wide portion of the second via 143 having the non-circular shape is disposed to be close to the center of the electronic component package 100B, stress may be concentrated on the wide portion, thereby obtaining a more excellent stress dispersion effect.

Meanwhile, referring to FIGS. 15C, 16C, 17C, and 18C, when the center of the electronic component package 100B is defined as C1, the center of the second via 143 is defined as C3, the virtual line connecting C1 and C3 to each other is defined as L3, an angle between a virtual line across distance S3 of the second via 143 in the first direction and L3 is defined as θ3, and an angle between a virtual line across distance S4 of the second via 143 in the second direction and L3 is defined as θ4, the second via 143 having the non-circular shape may satisfy θ3<θ4. Here, the distance S3 may be the shortest distance of any virtual line connecting a center of the second via 143 and any two arbitrary points on an edge of the second via 143 in horizontal cross section, and the distance S4, in the second direction perpendicular to the first direction determined by the virtual line having the distance S3, of a virtual line connecting the center of the second via 143 and two points on the edge of the second via 143 is greater than S3; or the distance S4 may be the longest distance of any virtual line connecting the center of the second via 143 and any two arbitrary points on the edge of the second via 143 in horizontal cross section, and the distance S3, in the first direction perpendicular to the second direction determined by the virtual line having the distance S4, of a virtual line connecting the center of the second via 143 and two points on the edge of the second via 143 is less than S4; or the distance S3 may be the shortest distance of any virtual line connecting the center of the second via 143 and any two arbitrary points on the edge of the second via 143 in horizontal cross section, the distance S4 may be the longest distance of any virtual line connecting the center of the second via 143 and any two arbitrary points on the edge of the second via 143, and the first direction determined by the virtual line having the distance S3 and the second direction determined by the virtual line having the distance S4 may be perpendicular to each other. In a case in which θ3 is smaller than θ4, when the wide portion of the second via 143 having the non-circular shape is disposed to be close to the center of the electronic component package 100B similarly as described above, stress may be concentrated on the wide portion, thereby obtaining an improved stress dispersion effect. Unlike this, in a case in which θ3 is equal to or larger than θ4, which means that the wide portion of the second via 143 having the non-circular shape is disposed distantly from the center of the electronic component package 100B, stress may be concentrated on a narrow portion, such that there is a limitation in obtaining the above-mentioned stress dispersion effect. θ3 may be equal to 0.

Figure 19A:
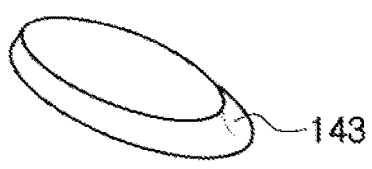
FIGS. 19A through 19D schematically illustrate various examples of a non-circular via applied to the electronic component package of FIG. 14.
Figure 19B:
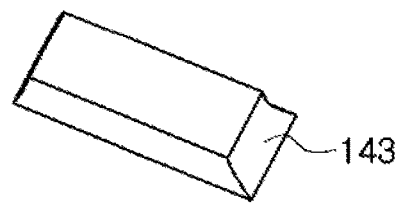
Figure 19C:
Figure 19D:
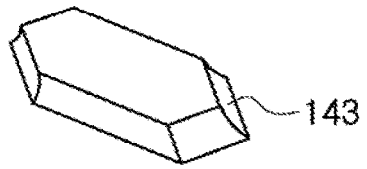

FIGS. 19A through 19D schematically illustrate various examples of a non-circular via applied to the electronic component package of FIG. 14. Referring to FIGS. 19A through 19D, similarly, a horizontal cross-section of the second via 143 having the non-circular shape may have an oval shape as illustrated in FIG. 19A, or a rectangular shape as illustrated in FIG. 19B. In addition, the horizontal cross-section of the second via 143 may have a diamond shape as illustrated in FIG. 19C, or a hexagonal shape as illustrated in FIG. 19D. However, these shapes are only examples suggested in order to describe the second via 143. That is, the second via 143 having the non-circular shape may have any shape in addition to the above-mentioned shapes as long as it may have the stress dispersion effect as described above.

Figure 20:
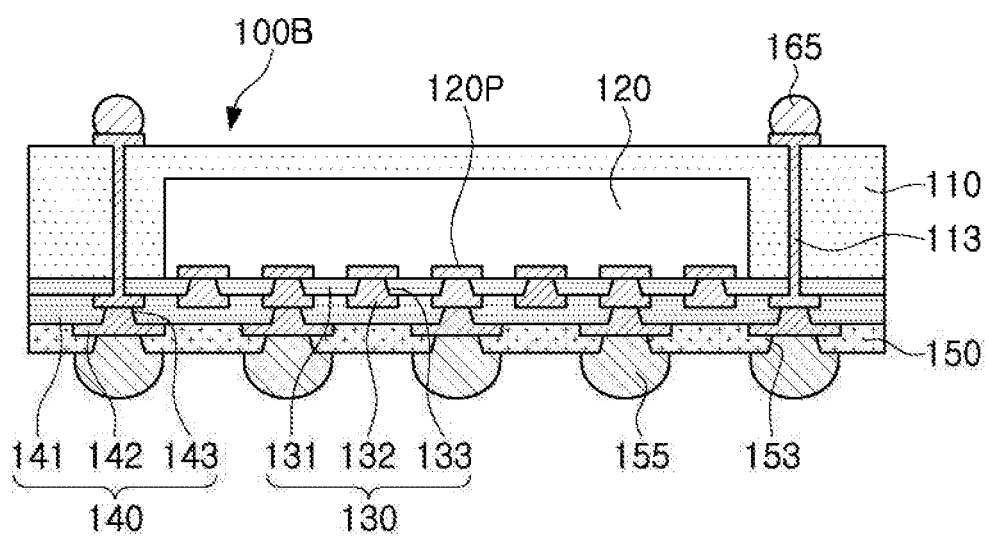
FIG. 20 is a cross-sectional diagram schematically illustrating a modified example of the electronic component package of FIG. 14.

FIG. 20 is a cross-sectional diagram schematically illustrating a modified example of the electronic component package of FIG. 14. Referring to FIG. 20, the electronic component package 100B according to another example may be a so-called package on package (PoP) type package. That is, the electronic component package 100B according to another example may further include a penetration wiring 113 penetrating through the encapsulant 110. Further, the electronic component package 100B may further include an upper connection terminal 165 connected to the penetration wiring 113. Each of the configurations is the same as described above.

Figure 21:
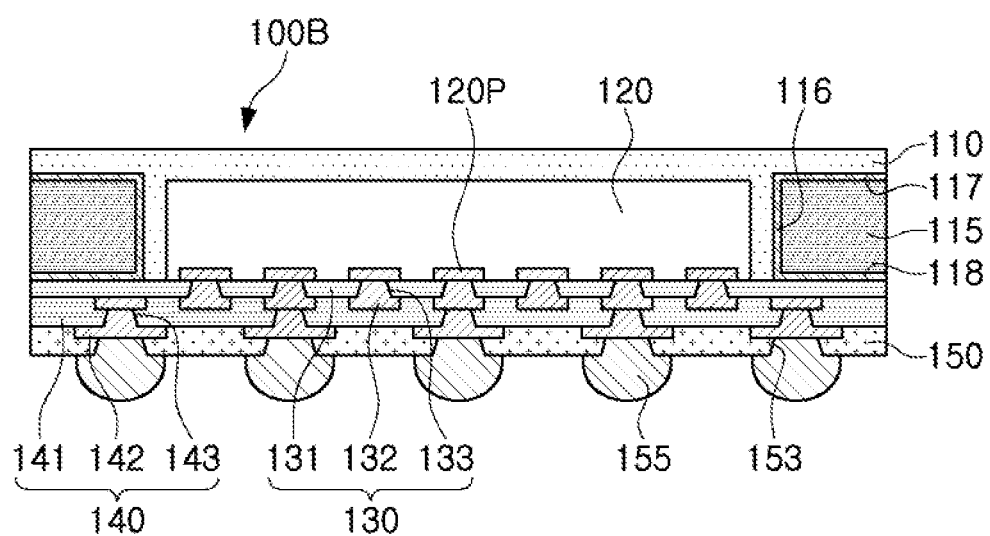
FIG. 21 is a cross-sectional diagram schematically illustrating a modified example of the electronic component package of FIG. 14.

FIG. 21 is a cross-sectional diagram schematically illustrating another modified example of the electronic component package of FIG. 14. Referring to FIG. 21, the electronic component package 100B according to another example may be a so-called panel level package (PLP) type package. That is, the electronic component package 100B according to another example may further include a frame 115 disposed on the redistribution layers 130 and 140 and having a through hole. In this case, the electronic component 120 may be disposed in the through hole of the frame 115. If necessary, metal layers 116, 117, and 118 may be disposed on an inner surface of the through hole of the frame 115, an upper surface of the frame 115, and/or a lower surface of the frame 115. Each of the configurations is the same as described above.

Figure 22:
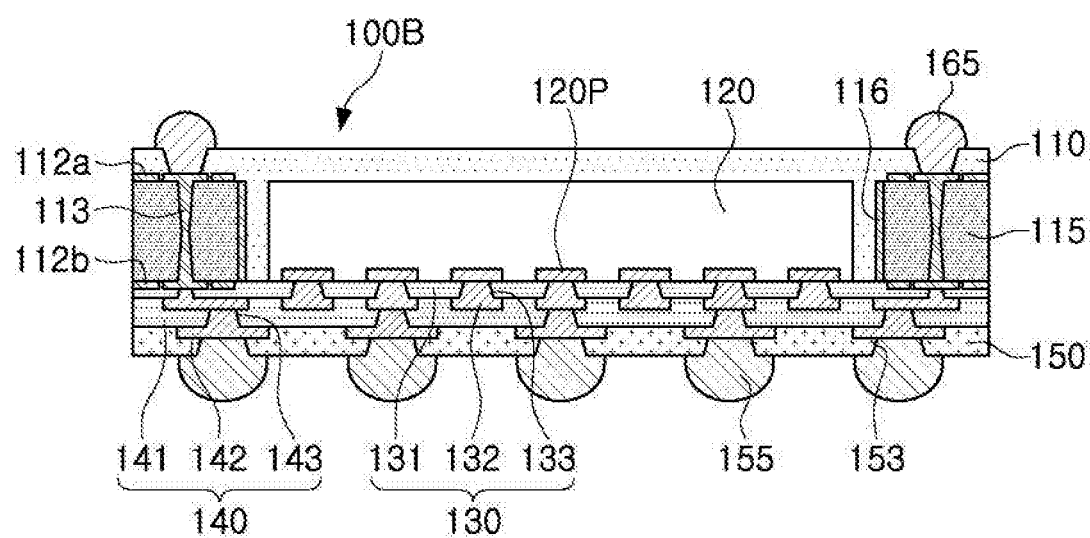
FIG. 22 is a cross-sectional diagram schematically illustrating a modified example of the electronic component package of FIG. 14.

FIG. 22 is a cross-sectional diagram schematically illustrating another modified example of the electronic component package of FIG. 14. Referring to FIG. 22, the electronic component package 100B according to another example may be simultaneously a so-called panel level package (PLP) type package and a so-called package on package (PoP) type package. That is, the electronic component package 100B according to another example may further include a penetration wiring 113 penetrating through a frame 115, wherein various conductive patterns 112a and 112b may be disposed on upper and lower surfaces of the frame 115, and if necessary, a metal layer 116 may be disposed on an inner surface of a through hole. Further, the electronic component package 100B may further include an upper connection terminal 165 connected to the penetration wiring 113. Each of the configurations is the same as described above.

Figure 23:
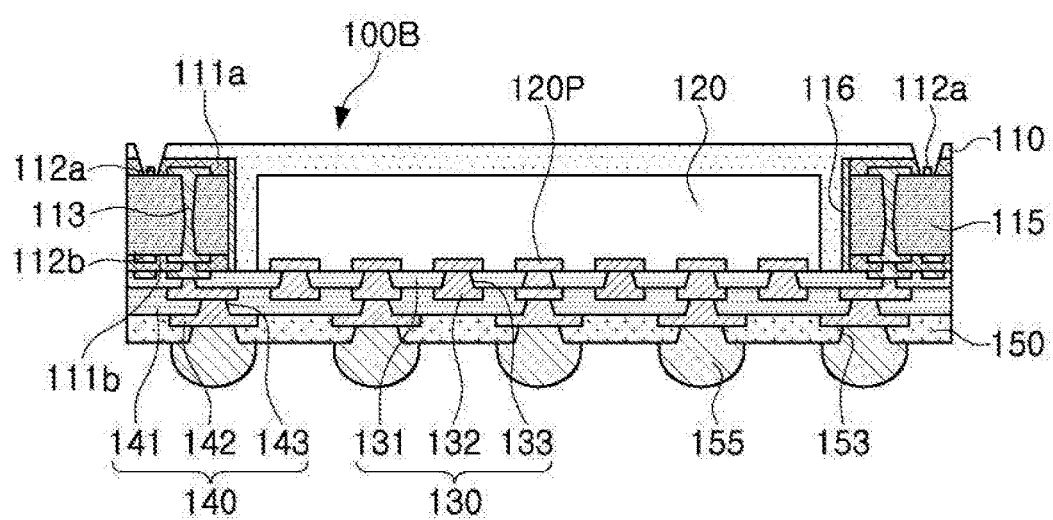
FIG. 23 is a cross-sectional diagram schematically illustrating a modified example of the electronic component package of FIG. 14.

FIG. 23 is a cross-sectional diagram schematically illustrating another modified example of the electronic component package of FIG. 14. Referring to FIG. 23, the electronic component package 100B according to another example may be simultaneously a so-called panel level package (PLP) type package and a so-called package on package (PoP) type package. That is, internal insulating layers 111a and 111b having through holes integrated with a through hole of a frame 115 may be further disposed on an upper surface and/or a lower surface of the frame 115. An opening (not denoted by a reference numeral) penetrating up to the encapsulant 110 may be formed in a first internal insulating layer 111a, such that a pattern 112a may be partially exposed externally through the opening. The exposed pattern 112a may serve as a pad of a wire bonding of an electronic component having different shape or an electronic component package, disposed on the package 100B. Other configurations are the same as described above.

As set forth above, according to exemplary embodiments in the present disclosure, the electronic component package in which reliability of the via of the redistribution layer is improved, and the electronic device including the same may be provided.

While exemplary embodiments have been shown and described above, it will be apparent to those skilled in the art that modifications and variations could be made without departing from the scope of the present invention as defined by the appended claims.

What is claimed is:

1. An electronic component package comprising:
a redistribution layer including a first insulating layer, a plurality of first conductive patterns disposed on a first side of the first insulating, and a plurality of first vias penetrating through the first insulating layer, electrically connected to the plurality of first conductive patterns, and including a via V;
an electronic component disposed on a second side of the first insulating layer opposing the first side; and
an encapsulant encapsulating the electronic component, wherein
the via V satisfies D1<D2, where C1 is a center of the electronic component package, C2 is the center of the via V, L1 is a virtual line connecting C1 and C2 along a diagonal line of the electronic component, L2 is a virtual line perpendicular to L1 and passing through C2, D1 is a distance between two points in the virtual line L1 and on an edge of the via V at which the edge meets L1, and D2 is a distance between two points in the virtual line L2 and on the edge of the via V at which the edge meets L2,
the via V is in direct contact with an electrode pad of the electronic component and is disposed at a first outmost corner of the electronic component in the diagonal line,
the plurality of first vias includes another via V1 disposed at a second outmost corner of the electronic component in the diagonal line and having a shape substantially the same as the via V, and
the plurality of first vias includes at least one circular-shaped via disposed between the first and second outmost corners.

2. The electronic component package of claim 1, wherein the horizontal cross-sectional shape of the via V is oval, rectangular, diamond, or hexagonal.

3. The electronic component package of claim 1, wherein the redistribution layer further includes a second insulating layer disposed on the first insulating layer, a second conductive pattern disposed on the second insulating layer, and a second via connecting one of the plurality of first conductive patterns and the second conductive pattern to each other while penetrating through the second insulating layer,
the second via having a horizontal cross-sectional shape of which a distance between fifth and sixth edge points of the second via on a virtual line passing through a center of the second via and the fifth and sixth edge points thereof in a third direction is shorter than a distance between seventh and eighth edge points of the second via on a virtual line passing through a center of the second via and the seventh and eighth edge points thereof in a fourth direction perpendicular to the third direction.

4. The electronic component package of claim 3, wherein the second via satisfies D3<D4, in which C3 is the center of the second via, L3 is a virtual line connecting C1 and C3 to each other, L4 is a virtual line perpendicular to L3 and passing through C3, D3 is a distance between two points on an edge of the second via at which the edge meets L3, and D4 is a distance between two points on the edge of the second via at which the edge meets L4.

5. The electronic component package of claim 3, wherein the second via satisfies θ3<θ4, in which C3 is the center of the second via, L3 is a virtual line connecting C1 and C3 to each other, θ3 is an angle between a virtual line across distance S3 of the second via in the third direction and L3, and θ4 is an angle between a virtual line across distance S4 of the second via in the fourth direction and L3.

6. The electronic component package of claim 3, wherein the redistribution layer includes a first region corresponding to a region in which the electronic component is disposed and a second region enclosing the first region, and
the second via is disposed in at least one of a corner of an outermost portion of the first region and a corner of an outermost portion of the second region.

7. The electronic component package of claim 3, wherein the redistribution layer includes a first region corresponding to a region in which the electronic component is disposed and a second region enclosing the first region, and
the second via is disposed in at least one of a corner portion of an outermost portion of the first region and a corner portion of an outermost portion of the second region.

8. The electronic component package of claim 3, wherein the redistribution layer includes a first region corresponding to a region in which the electronic component is disposed and a second region enclosing the first region, and
the second via is disposed in at least one of an outermost portion of the first region and an outermost portion of the second region.

9. The electronic component package of claim 3, wherein the redistribution layer includes a first region corresponding to a region in which the electronic component is disposed and a second region enclosing the first region, and
the second via is disposed at a corner portion of an outer portion of the second region.

10. The electronic component package of claim 3, wherein the redistribution layer includes a first region corresponding to a region in which the electronic component is disposed and a second region enclosing the first region, and the second via is disposed at an outermost corner of the first region and a portion of the second region enclosing the corner of the outermost portion of the first region.

11. The electronic component package of claim 1, further comprising:

a passivation layer disposed below the redistribution layer and having an opening; and a connection terminal disposed in the opening of the passivation layer.

12. The electronic component package of claim 11, wherein the passivation layer is a solder resist layer, and the connection terminal is a solder ball.

13. The electronic component package of claim 1, further comprising a frame disposed on the redistribution layer and having a through hole, wherein the electronic component is disposed in the through hole of the frame.

14. The electronic component package of claim 13, further comprising:

a penetration wiring penetrating through the frame; and conductive wiring patterns disposed on both surfaces of the frame opposing each other, and connected to each other by the penetration wiring, wherein the penetration wiring and the wiring pattern are electrically connected to the electronic component through the redistribution layer.

15. The electronic component package of claim 1, wherein the via V is the only via that is in direct contact with the electrode pad of the electronic component.

* * * * *